US 6,717,434 B2

(12) United States Patent
Takahashi et al.

(10) Patent No.: US 6,717,434 B2
(45) Date of Patent: Apr. 6, 2004

(54) LOGIC CIRCUIT MODULE HAVING POWER CONSUMPTION CONTROL INTERFACE AND A RECORDING MEDIUM STORING THE MODULE

(75) Inventors: Yoshitaka Takahashi, Hitachi (JP); Masahiko Saito, Mito (JP); Hidemitsu Naya, Hitachi (JP); Mutsumi Kikuchi, Hitachi (JP); Takashi Hotta, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 53 days.

(21) Appl. No.: 09/963,494

(22) Filed: Sep. 27, 2001

(65) Prior Publication Data
US 2002/0133241 A1 Sep. 19, 2002

(30) Foreign Application Priority Data
Feb. 23, 2001 (JP) ........................................ 2001-049302

(51) Int. Cl.[7] .............................................. H03K 19/173
(52) U.S. Cl. ............................................ 326/37; 326/93
(58) Field of Search ............................. 326/37, 38, 39, 326/40, 41, 93–98

(56) References Cited

U.S. PATENT DOCUMENTS

| 5,585,750 | A |  | 12/1996 | Noguchi et al. |
| 5,675,808 | A |  | 10/1997 | Gulick et al. |
| 5,737,616 | A |  | 4/1998 | Watanabe |
| 5,781,780 | A |  | 7/1998 | Walsh et al. |
| 5,812,860 | A |  | 9/1998 | Horden et al. |
| 5,987,614 | A | * | 11/1999 | Mitchell et al. ............. 713/300 |
| 6,161,187 | A | * | 12/2000 | Mason et al. ............... 713/322 |
| 6,208,171 | B1 | * | 3/2001 | Kumagai et al. ........... 326/121 |
| 6,460,168 | B1 | * | 10/2002 | Yamamoto et al. ............ 716/8 |

FOREIGN PATENT DOCUMENTS

| EP | 783148 | 7/1997 |
| EP | 0991191 | 4/2000 |
| JP | 10187300 | 7/1998 |
| WO | 0101228 | 1/2001 |

* cited by examiner

Primary Examiner—Don Le
(74) Attorney, Agent, or Firm—Antonelli, Terry, Stout & Kraus, LLP

(57) ABSTRACT

Consumption power control is provided for a system LSI made of a combination of a plurality of reusable logic circuit modules, i.e., Intellectual Property (IP) cores. Hardware resources such as interfaces and registers for the consumption power control of other IP cores are prepared and controlled by software for the consumption power control of a system LSI. The consumption power can be controlled at an IP core level. A method is provided which facilitates a system LSI designer to enter a consumption power control specification of a system LSI when the system LSI is configured.

9 Claims, 25 Drawing Sheets

FIG. 21A

1: MODULE MAIN(SIG106,···,
2: //FOR POWER CONTROL INTERFACE
3:        SIG113,SIG111,
4:        SIG123,SIG121,
5:        SIG14,SIG122,
6:        SIG108,SIG109,
7: INOUT SIG106,···,
8: INPUT SIG113,SIG111,···,
9: OUTPUT SIG114,SIG122,SIG123,SIG121,···,
     ⋮     } CIRCUIT DESCRIPTION
10: ENDMODULE

FIG. 21B

1: MODULE BUF(SIG117,SIG118,
2: //FOR POWER CONTROL INTERFACE
3:        SIG144,SIG123,
4:        SIG113,
5: INOUT SIG116,SIG117,SIG118;
6: INPUT SIG123,SIG144;
7: OUTPUT SIG113;
     ⋮     } CIRCUIT DESCRIPTION
8: ENDMODULE

LOGIC CIRCUIT MODULE HAVING POWER CONSUMPTION CONTROL INTERFACE AND A RECORDING MEDIUM STORING THE MODULE

BACKGROUND OF THE INVENTION

The present invention relates to a logic circuit module and a semiconductor integrated circuit having a recording medium storing the module, and more particularly to a semiconductor integrated circuit having a function of controlling a power consumption of another semiconductor integrated circuit.

An example of a conventional method of lowering a power consumption of a semiconductor integrated circuit is described in JP-A-07-20968. With this method, the consumption power of a computer is reduced by dynamically changing the operating voltage and frequency. Namely, by dynamically lowering the operating voltage and clock speed, the power consumption of the computer system is reduced.

An example of an interface to the external is described in JP-A-06-202753 entitled "Method of Stopping Clocks of Computer System and Processor". A clock control signal input is provided in an external interface of a logic circuit. By inputting a signal to the external interface, clocks of a CPU can be stopped at any time irrespective of an instruction currently executed by the processor, while the defined status of the processor is ensured.

In "Integrated Circuit and Computer System" disclosed in JP-A-2000-132263, a common monitor clock is used for different modules in each integrated circuit and the total power consumption is reduced by a combination of an active power-down control and a passive power-down control.

The above-described conventional methods do not provide, however, sufficient consideration of a system LSI constituted of a combination of a plurality of reusable logic circuit modules (IP cores: IP is an acronym for Intellectual Property). Generally, in configuring a system LSI from a combination of IP cores, which IP cores are to be disposed in the system LSI is not still decided at the time of design (FIG. 22). Although the above-described conventional methods describe the technique of a power voltage control to control a power consumption, they do not disclose a method of changing the power voltage of only some circuit modules of a system LSI.

SUMMARY OF THE INVENTION

It is an object of the present invention to provide a logic circuit module capable of implementing a power consumption control of a system LSI and to a recording medium storing the module.

It is another object of the present invention to provide a logic circuit module capable of controlling a power consumption at an IP core level and a recording medium storing the module.

It is another object of the invention to provide a method of facilitating a system LSI designer to input specifications for the power consumption control of a system LSI when the system LSI is configured.

One feature of the invention is that a logic circuit module having a processor has a consumption power control function and an interface to be controlled by another logic circuit module.

Another feature of the invention is that a logic circuit module having a processor has a consumption power control function and an interface to control another logic circuit module.

According to one aspect of the invention, hardware resources such as interfaces and registers for the consumption power control of other IP cores are prepared and controlled by software to implement the consumption power control of a system LSI.

According to other aspects of the invention, the consumption power control can be performed at an IP core level and there is provided a method of facilitating a system LSI designer to input specifications for the power consumption control of a system LSI when the system LSI is configured.

Other objects, features and advantages of the present invention will become apparent from the following description of the embodiments of the invention taken in conjunction with the accompanying drawings.

BRIEF DESCRIPTION OF THE DRAWINGS

FIGS. 21A and 21B are schematic diagrams illustrating signal connections and power connections as an automatically generated consumption power interface.

In the drawings, identical reference symbols and numerals represent identical or similar components.

DETAILED DESCRIPTION OF THE EMBODIMENTS

A first embodiment of the invention will be described with reference to the accompanying drawings.

The process of designing a system LSI by using IP cores embodying the invention will be described first, and then the whole structure of a specific system using a system LSI embodying the invention will be described. An example of the system operation will be described thereafter.

Figure 22:
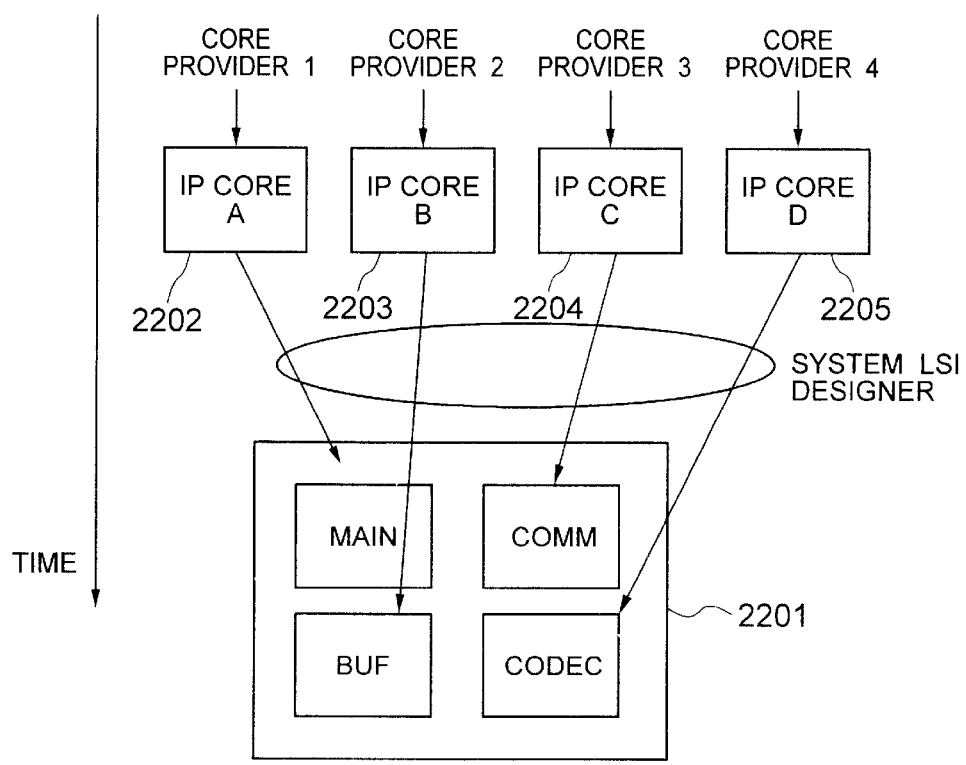
FIG. 22 is a schematic diagram showing the relation between a system LSI of an embodiment and IP cores constituting the system LSI.

FIG. 22 briefly shows the relation between a system LSI according to an embodiment and IP cores constituting the system LSI.

In FIG. 22, reference numeral 2201 represents a system LSI, and reference numerals 2202 to 2205 represent cores disposed in the system LSI.

A system LSI designer selects necessary cores in accordance with the specification of a system LSI to be designed and receives (buys) the cores from core providers 1 to 4. Generally, the system LSI designer is provided with an IP core by receiving a recording medium storing design information or by receiving the same information as that stored in the recording medium via a network. At the time of IP core design, it is not still determined that the IP cores are used to what type of a system LSI. Therefore, if conventional techniques which do not consider this point are used, it is not easy to design a system LSI which performs consumption power control at an IP core level. According to the invention, this problem is solved by introducing a consumption power interface to an IP core.

Figure 26:
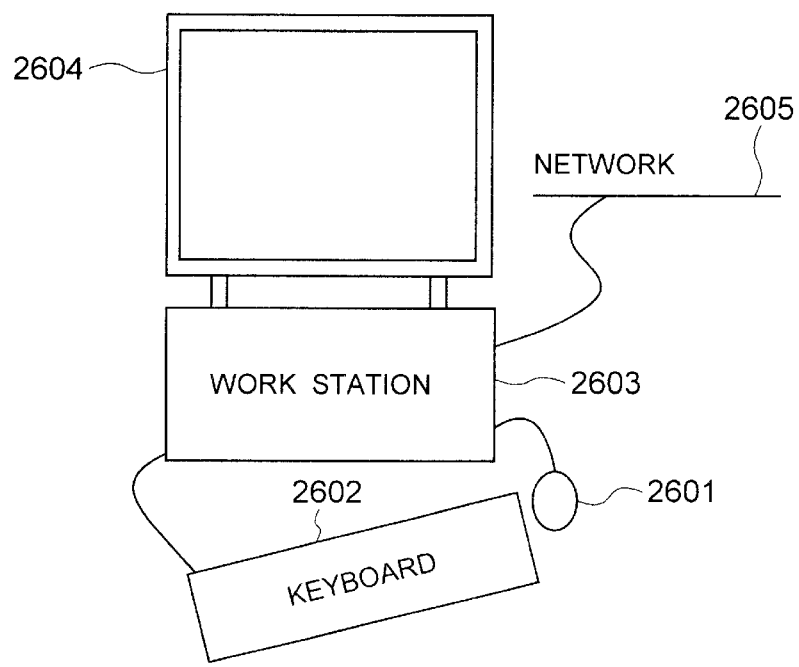
FIG. 26 is a schematic diagram showing a work station system used by the system LSI design tool.

FIG. 26 shows a work station system to be used by a system LSI design work.

Figure 25:
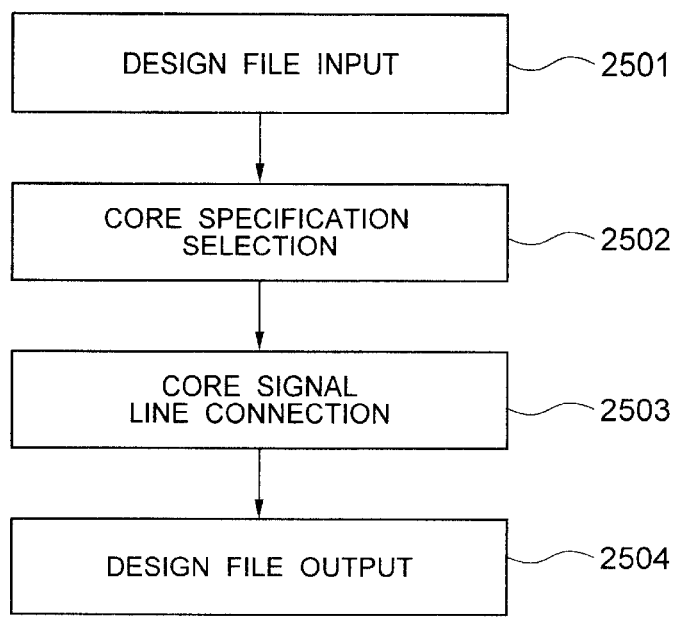
FIG. 25 is a flow chart illustrating the whole operation of the system LSI design tool.

Reference numeral 2604 represents a display, 2603 represents a work station, 2601 represents a mouse, 2602 represents a keyboard, and 2605 represents a network. FIG. 25 shows the whole flow of a system LSI design tool (software) to be executed by the work station 2603.

FIG. 25 shows the whole flow of a system LSI design tool to be executed by the work station 2603.

In FIG. 25, reference numeral 2501 represents a design file input process, 2502 represents a core specification selection process, 2503 represents a core signal line connection process, and 2504 represents a design file output process.

The design file input process 2501 reads information of an IP core received from a core provider.

The core specification selection process 2502 designates each specification of a consumption power control of an IP core through a graphical interface. This process will be later described with reference to FIG. 20.

The core signal line connection process 2503 determines connections between general signal lines other than those lines used for the consumption power control between IP cores, through a graphical interface. This connection result and the result by the core specification selection process 2502 are used to determine connections of signal lines and power lines between IP cores. In this case, if there is a possibility that a power voltage difference exists at both ends of a signal line connection between IP cores, a level shifter circuit (to be described later) is automatically inserted. For example, in FIG. 2, level shifter circuits 242 and 243 are used. In this embodiment it is assumed that connection signal lines between IP cores all operate at a signal amplitude of 5 V. It is also assumed that connection signal lines operate at 1.8 V or 3.3 V in each IP core depending upon its status.

The design file output process 2504 outputs a design file subjected to the processes 2501 to 2503 to a file or a recording medium. The output design file is used as an input file to the process to be executed by a logic synthesis tool, which process is the next process of the system LSI design. After all processes of the system LSI design are completed, a final design file is passed to a system LSI manufacture process. After manufacture processes at a semiconductor manufacture line, a chip of a system LSI is obtained.

Figure 20:
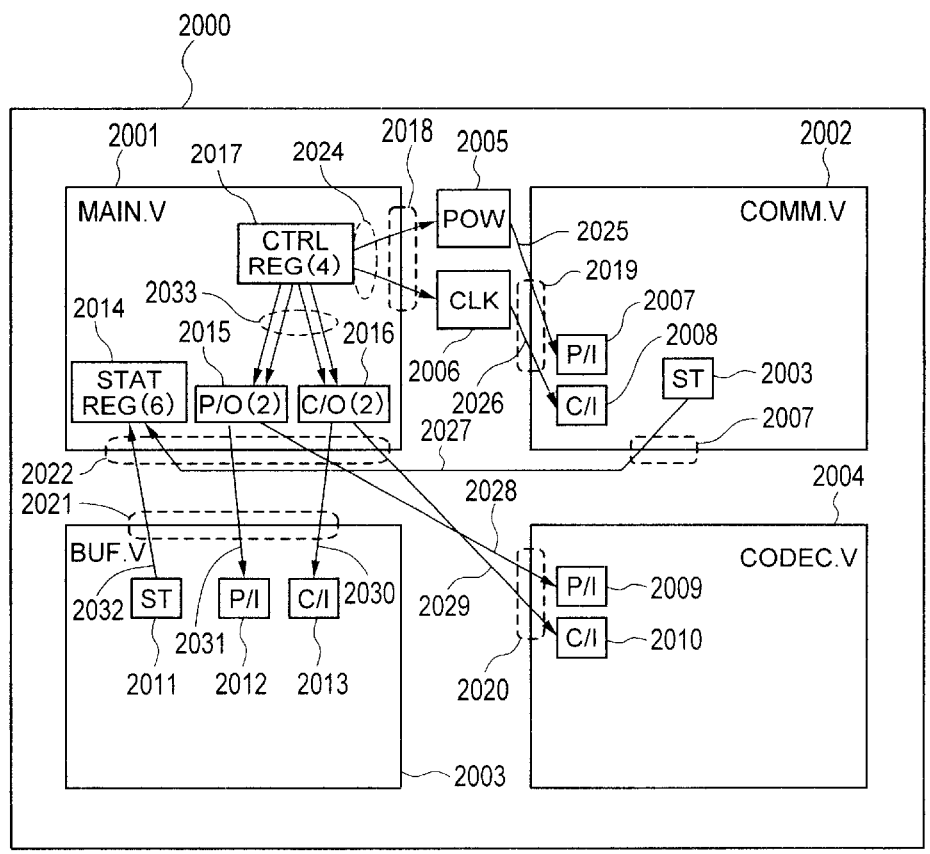
FIG. 20 is a schematic diagram illustrating how a system LSI design tool is used.

FIG. 20 shows how the specification of the consumption power control is determined through a graphical interface.

In FIG. 20, reference numeral 2000 represents a work station display screen, 2001 represents a main processor image, 2002 represents a communication processor image, 2004 represents a CODEC processor image, 2003 represents a buffer processor image, 2005 represents an external power circuit image, 2006 represents an external clock generator circuit image, 2017 represents a consumption power control register image, 2014 represents a consumption power status register image, 2015 represents a power output image, 2016 represents a clock output image, 2007, 2009 and 2012 represent power input images, 2008, 2010 and 2013 represent clock input images, 2011 and 2003 represent status output circuit images, 2018 to 2021 represent consumption power control interfaces, and 2024 to 2033 represent connection images.

The system LSI designer lays out the main processor image 2001, communication processor image 2002, CODEC processor image 2004 and buffer processor image 2003 on the display screen 2000 as shown.

The numeral "2" displayed on the power output image 2015 and clock output image 2016 means that there are two outputs. Similarly, the numeral "4" displayed on the consumption power register image 2017 and the numeral "6" displayed on the consumption power status register image 2014 mean that there are four and six register bits, respectively. It is assumed that the system LSI designer decides that the buffer processor and codec processor are controlled by the power output and clock output from the main processor. The system LSI designer connects the power output image 2015 and power input images 2012 and 2009 to the connection images 2031 and 2028, and also connects the clock output image 2016 to the clock input images 2013 and 2010. As a connection for a performance improvement request signal, the status output circuit images 2011 and 2003 are connected to the consumption power request status register 2014. Next, the system LSI designer prepares an external power and a clock generator circuit. Namely, the external power image 2005 and external clock generator circuit image 2006 are displayed on the display screen, and the consumption power control register image 2017 is connected to the external power circuit image 2005 and external clock generator circuit 2006. The system LSI designer establishes the connections indicated by the connection images 2025, 2026 and 2033. With these connection works, signal connections and power connections for the consumption power control are automatically established for the consumption power control interface images 2018 to 2021.

With reference to FIGS. 21A and 21B, signal connections and power connections as automatically generated consumption power interfaces will be described.

FIG. 21A shows system LSI design information for the main processor shown in FIG. 2 to be described later. This information is defined by a hardware descriptive language.

The first row indicates that the name of the main processor is "main". It can be seen that there is a description sig106 for the signal line 106 shown in FIG. 2.

The second row is a comment having no meaning as design information and being output in order to make easy to read.

The third to sixth rows indicate that signal lines sig113, sig111, sig123, sig121, sig114 and sig122 are assigned to the consumption power interfaces. Whether these signal lines are input signal lines, output signal lines or input/output signal lines is described in the seventh to tenth rows.

Figure 2:
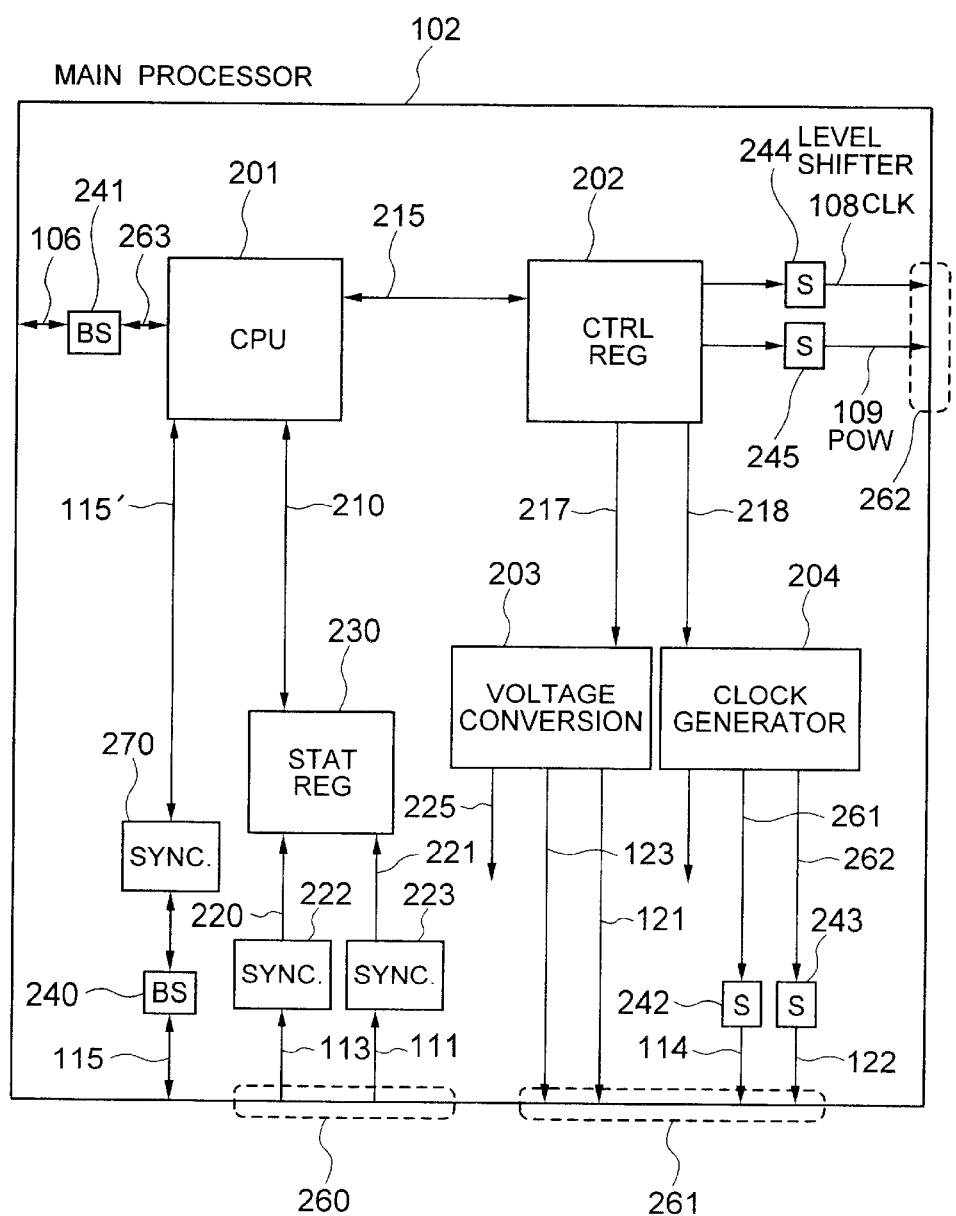
FIG. 2 is a block diagram showing the structure of a main processor shown in FIG. 1.

FIG. 21B shows system LSI design information of the buffer processor shown in FIG. 2 to be described layer. This information is defined by a hardware descriptive language.

Figure 3:
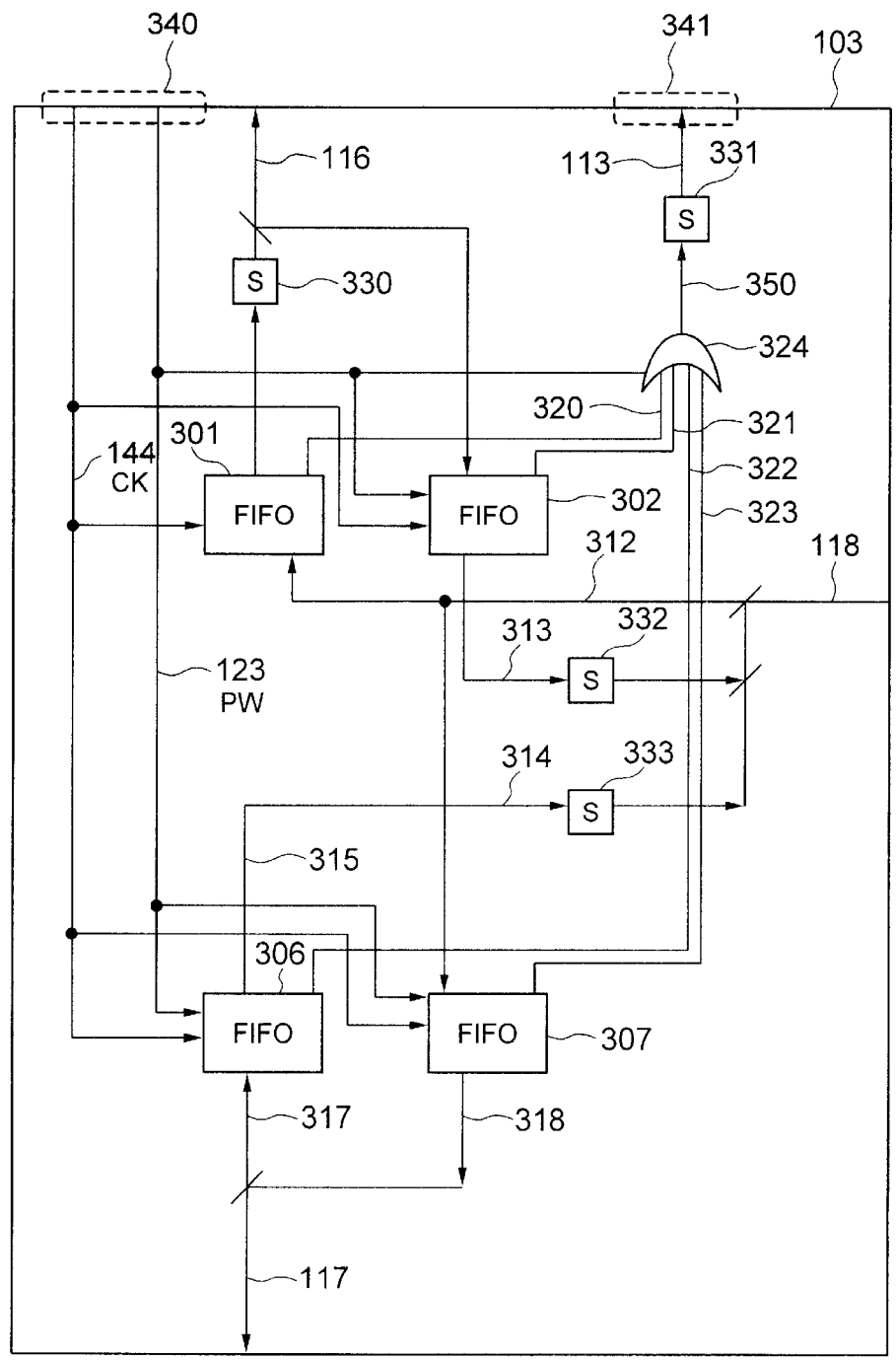
FIG. 3 is a block diagram showing the structure of a buffer processor shown in FIG. 1.

The first row indicates that the name of the main processor is "buf" and that there is a description sig117 for a signal line 117 shown in FIG. 3.

The second row is a comment having no meaning as design information and being output in order to make easy to read.

The third to fourth rows indicate that signal lines sig144, sig123, and sig113 are assigned to the consumption power interfaces. Whether each of the first, third and fourth rows of the signal lines is an input signal line, output signal line or input/output signal line is described in the fifth to seventh rows. In FIGS. 21A and 21B, the same signal name (e.g., sig113) indicates a connection of a port with sig113 in the "main" and "buf".

Figure 7:
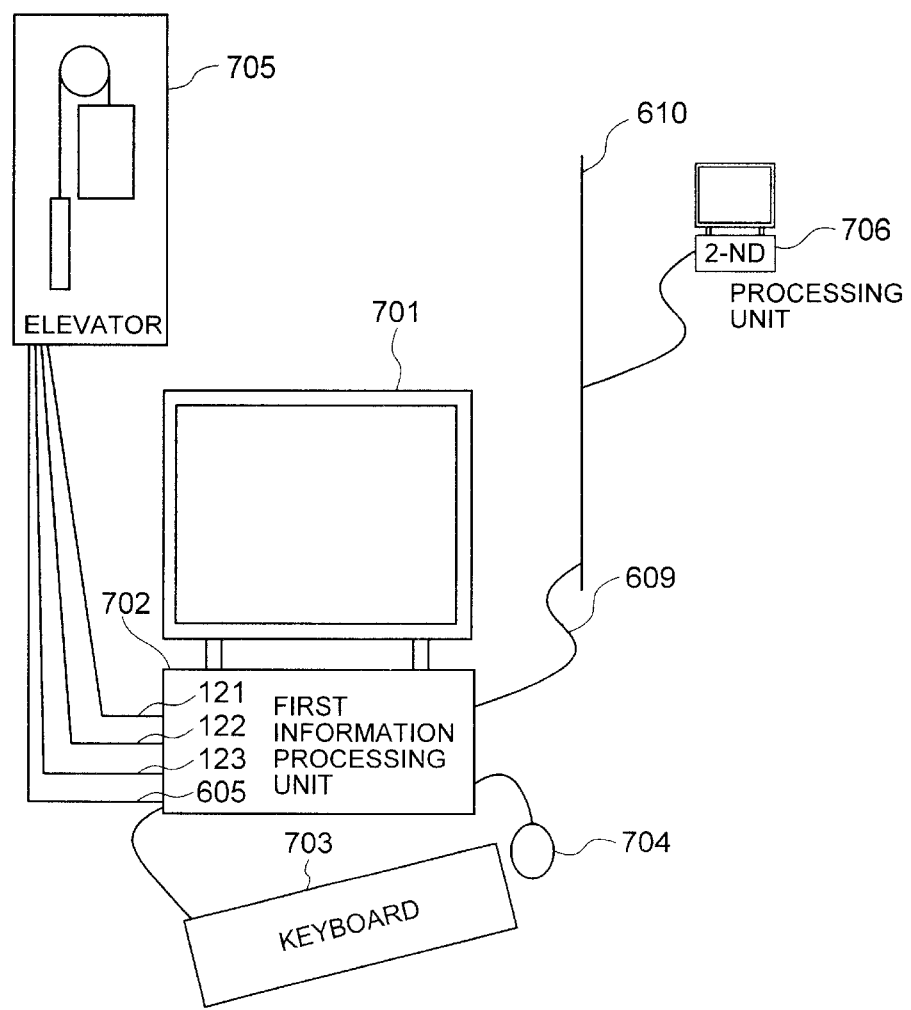
FIG. 7 shows the total structure of an information processing circuit applying the first embodiment of the invention.

FIG. 7 shows the whole structure of an information processing circuit embodying the invention.

In FIG. 7, reference numeral 701 represents a display, 702 represents a first information processing circuit, 703 represents a keyboard, 704 represents a mouse, 705 represents an elevator, 706 represents a second information processing circuit, 121 to 123 represent signal lines for serial communications, 605 represents an I/O signal line and 610 represents a network.

The information processing circuit 702 receives an input from an operator via the keyboard 703 and mouse 704, communicates with the elevator to be controlled via the signal lines 121, 122 and 123, receivers sensor information input via the signal line 605, and outputs the information to be displayed on a display device of the elevator via the signal line 605. The information processing circuit 702 transfers information to and from the other information processing apparatus 706 via the network 610 to display information processing history or the like on the display device. As an application of this invention, a controller for an elevator is described. However, other apparatus can also be controlled in a similar manner.

Figure 6:
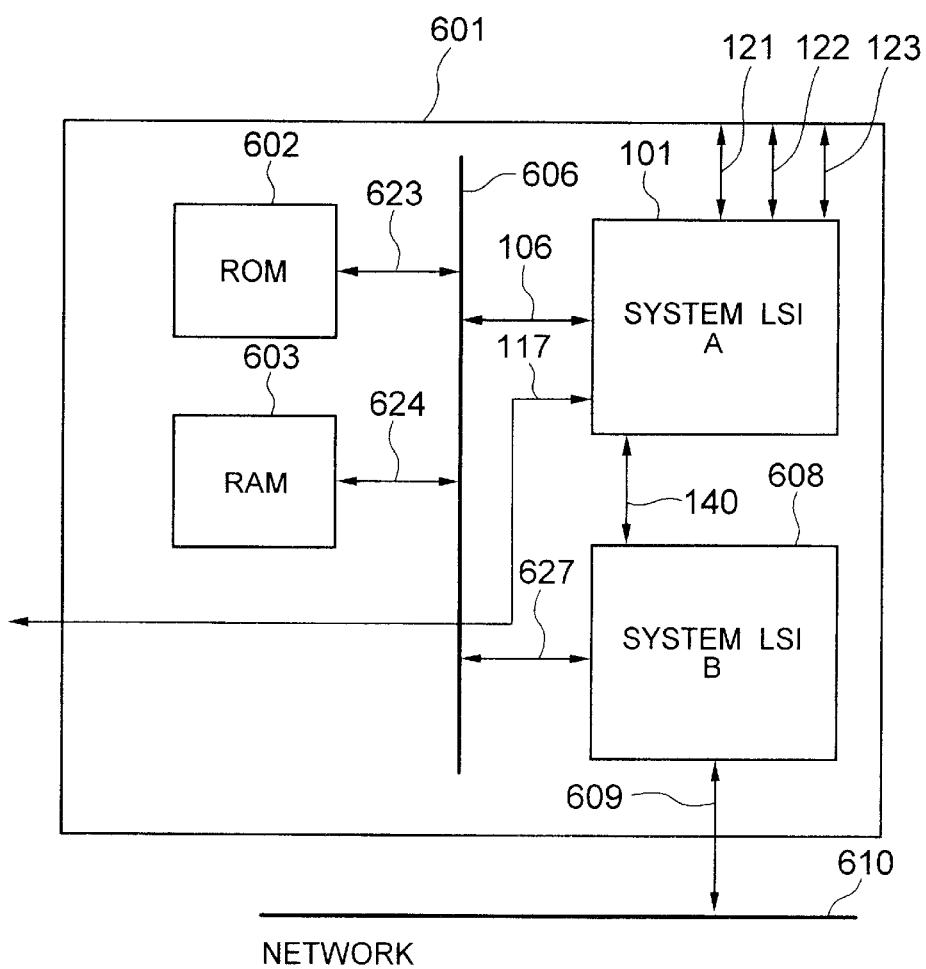
FIG. 6 shows an example of an application of the first embodiment of the invention to a board.

FIG. 6 shows a board using a system LSI of this invention. This board is built in the information processing circuit 702 shown in FIG. 7.

In FIG. 6, reference numeral 601 represents an information processing board, 602 represents a read only memory (ROM), 603 represents a random access memory (RAM), 101 represents a first system LSI, 608 represents a second system LSI, 606 represents a bus, and 610 represents a network.

ROM 602 and RAM 603 store program and data for the processors built in the system LSI's 101 and 608, these program and data being supplied via the bus 606.

The system LSI 101 receives information from various sensors of the elevator via a signal line 117, and outputs control information to be displayed on the display device of the elevator via the signal line 117. The system LSI 101 outputs intermediate result data to RAM 603 by using the program and data stored in ROM 602 and RAM 603. The system LSI 101 transfers consumption power control information to and from the system LSI 608 via a signal line 140 to manage the consumption power of the whole board. The system LSI 608 has a network connection function to control the elevator 705 in cooperation with the system LSI 101.

Figure 1:
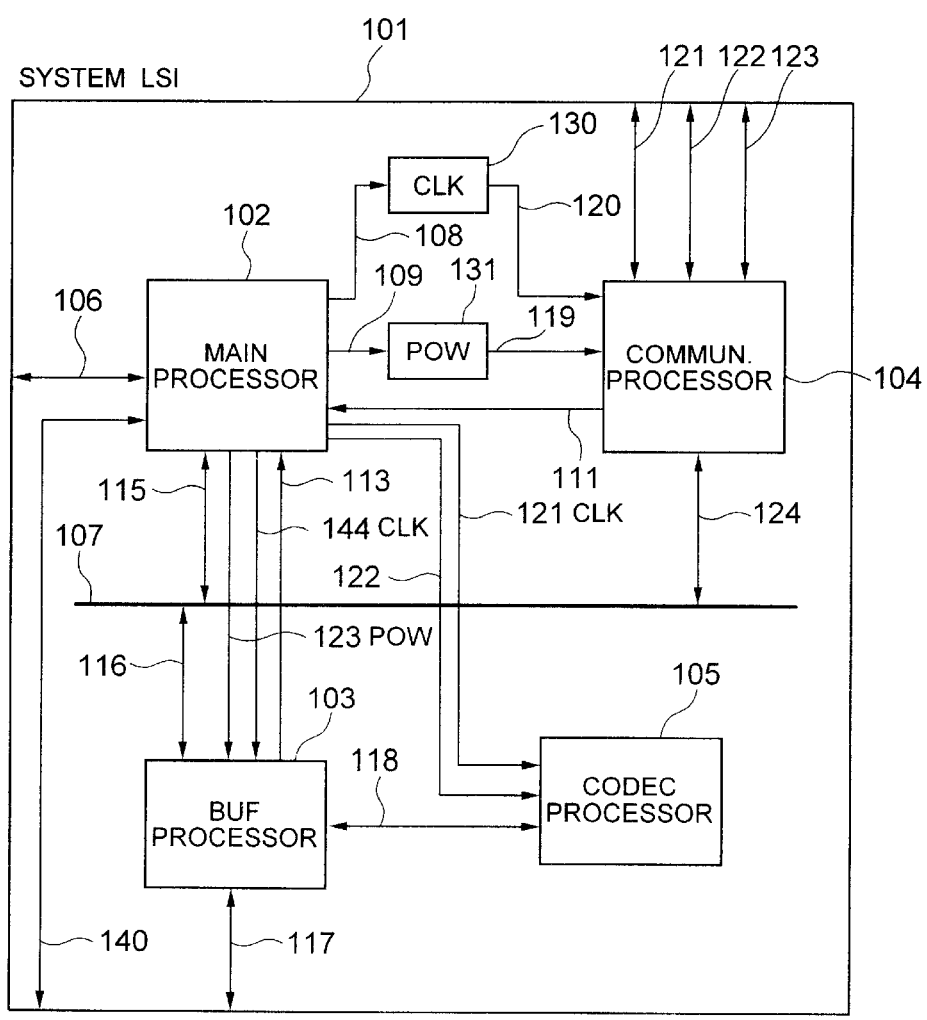
FIG. 1 is a block diagram showing the structure of a system LSI according to a first embodiment of the invention.

FIG. 1 shows an example of the structure of a system LSI of the invention.

In FIG. 1, reference numeral 101 represents a system LSI, 102 represents a main processor, 103 represents a buffer processor, 104 represents a communication processor, 105 represents a coding/decoding (CODEC) processor, 107 represents a bus, 130 represents a clock generator circuit, and 131 represents a power circuit.

The main processor 102 performs an instruction access and a data access to an external memory of the system LSI via a signal line 106, outputs a clock frequency control signal to a signal line 108, and outputs a power control signal to a signal line 109. The main processor 102 receives consumption power control information via a signal line 111. The main processor 102 supplies power to the buffer processor 103 and CODEC processor 105 via power lines 123 and 122, and outputs a clock signal to the buffer processor 103 and CODEC processor 105 via signal lines 114 and 121. The main processor 102 receives a performance improvement request signal for the consumption power control of the buffer processor 103 via a signal line 113. The main processor 103 executes an arithmetic and logic process by transferring information to and from the buffer processor 103, communication processor 104 and CODEC processor 105 via a signal line 115 and a bus 107.

The buffer processor 103 receives coded data via a signal line 117, outputs the coded data to the CODEC processor 105 via a signal line 118, and receives decoded data via the signal line 118. The buffer processor 103 receives coded data via the signal line 118 and outputs the coded data to the signal line 117.

The communication processor 104 receives signals from the three-channel signal lines 121, 122 and 123 to perform a reception process. The communication processor 104 performs a transmission process of outputting signals to the signal lines 121, 122 and 123.

The CODEC processor 105 transfers data to and from the signal line 118 for encoding and decoding, receives the clock signal from the main processor 102 via the signal line 121, and receives power from the power line 122.

The clock generator circuit 130 receives the clock frequency control signal via the signal line 108 and outputs a clock signal designated by the control signal to a signal line 120.

The power circuit 131 receives the power control signal via the signal line 109 to generate voltage designated by the control signal and supply power to the communication processor via a power line 119.

The communication processor 104 communicates with the controller of the elevator via signal lines 121 to 123, receives the clock signal via the signal line 120, receives the power from the power line 119, outputs a performance improvement request signal to the signal line 111, and transfers communication data to and from another module via a signal line 124.

FIG. 2 shows an example of the structure of the main processor 102 shown in FIG. 1.

In FIG. 2, reference numeral 201 represents a central processing unit (CPU), 202 represents a consumption power control register, 230 represents a consumption power request status register, 203 represents a power circuit (voltage converter), 204 represents a clock generator circuit, 222, 223 and 270 represent synchronization circuits, 240 and 241 represent bidirectional voltage level shifters, 242 to 245 represent voltage level shifters, and 260 to 262 represent consumption power control interfaces. The bidirectional voltage level shifters 240 and 241 will be later described with reference to FIG. 4B. The voltage level shifters 244 and 245 will be later described with reference to FIG. 17.

CPU 201 accesses the register 202 via a signal line 215, accesses the external of the chip via a signal line 263, transfers sensor information and display information to and from the elevator via a signal line 260. CPU 201 accesses the register 230 via a signal line 210.

The consumption power control register 202 receives a register set signal or a register reset signal from CPU 201 via the signal line 215 to change the value of the register. The consumption power control register 202 loads the current operation status of each module of the system LSI 101 such as main processor 102, buffer processor 103, communication processor 104, and CODEC processor 105.

The power processor 203 receives a control signal from a signal line 217 and power from the outside of the system LSI via an unrepresented power line to perform voltage conversion and output power to power lines 225, 123 and 121. This power output is assumed to be 1.8 V or 3.3 V. It is generally known that a consumption power of a logic circuit is proportional to the square of a supply voltage. If a supply voltage of a logic circuit is lowered, the consumption power of the logic circuit can be reduced although the highest operation frequency lowers. The main processor 102 such as CPU 201 and register 202 operates by the power supplied from the power line 225. Conventionally, a circuit such as the power circuit 203 is not almost disposed in an IP core. The main reason for this is the technical difficulty of forming a power circuit on the same chip. However, recently, it becomes possible to form a power circuit on the same chip. If a power circuit is formed on the same chip as that of logic circuits of an IP core, the management of power circuits can be performed collectively with signal lines interconnecting IP cores. A system LSI design work becomes easy for a system LSI designer. The "power circuit" of the main processor 102 means a "voltage converter circuit" such as a DC/DC converter and a VRM (Voltage Regulation Module).

The clock generator circuit 204 receives a control signal from a signal line 218 and outputs a clock signal to signal lines 231, 114 and 122. The clock signal is assumed to have a frequency of 15 MHz or 90 MHz. By using the clock signal supplied to the signal line 231, the main processor 102 such as CPU 201 and register 202 operates. It is generally known that the consumption power of a logic circuit is proportional to an operation clock frequency. If the clock frequency of the logic circuit is lowered, the consumption power of the logic circuit can be reduced although the processing speed (operation speed) lowers. A consumption power, i.e., performance can be controlled effectively by using a combination of the supply voltage control and clock frequency control.

The consumption power request status register 230 receives a set request or a reset request via signal lines 220 and 221, and changes the register values. The register 230 loads a request signal for the consumption power, i.e., performance of each module of the system LSI such as the main processor 102, buffer processor 103, communication processor 104 and CODEC processor 105.

The synchronization circuits 222 and 223 synchronize input signals from signal lines 113, 111 and 115 by using the clock signal of the main processor 102 supplied via the signal line 231, and output the synchronized signals to signal lines 220, 221 and 115'.

A consumption power of another IP core is controlled via the consumption power control interfaces 260 to 262 to thereby control the total consumption power of the system LSI.

FIG. 3 is a diagram showing the structure of the buffer processor 103 shown in FIG. 1.

In FIG. 3, reference numerals 301, 302, 306 and 307 represent first in first out (FIFO) buffers, 144 represents a clock signal line, 123 represents a power line, 330 to 333 represent voltage shifters, 324 represents an OR gate, and 340 and 341 represent power control interfaces.

The FIFO buffer 306 buffers data received from a signal line 317 and outputs the buffered data to a signal line 315. The FIFO buffer 306 outputs a busy signal indicating that "data exists in buffer" to a signal line 322. The signal line 322 is then at a logic "1".

The FIFO buffer 301 buffers data received from a signal line 312 and outputs the buffered data to a signal line 116. The FIFO buffer 301 outputs a busy signal indicating that "data exists in buffer" to a signal line 320. The busy signal has a logic "1".

The FIFO buffer 302 buffers data received from a signal line 116 and outputs the buffered data to a signal line 313. The FIFO buffer 302 outputs a busy signal indicating that "data exists in buffer" to a signal line 321. The busy signal has a logical value "1".

The FIFO buffer 307 buffers data received from a signal line 312 and outputs the buffered data to a signal line 318. The FIFO buffer 307 outputs a busy signal indicating that "data exists in buffer" to a signal line 323. The busy signal has a logical value "1".

The level shifter 330 raises the amplitude of an input signal to an output side voltage level and outputs it to the output side.

The OR gate 324 receives busy signals from the FIFO buffers and outputs a consumption power control request signal to a signal line 113.

The clock signal and power are supplied from the main processor 102 via the consumption power control interface 340.

The consumption power control signal is output to the main processor 102 via a signal line 341.

Figure 4A:
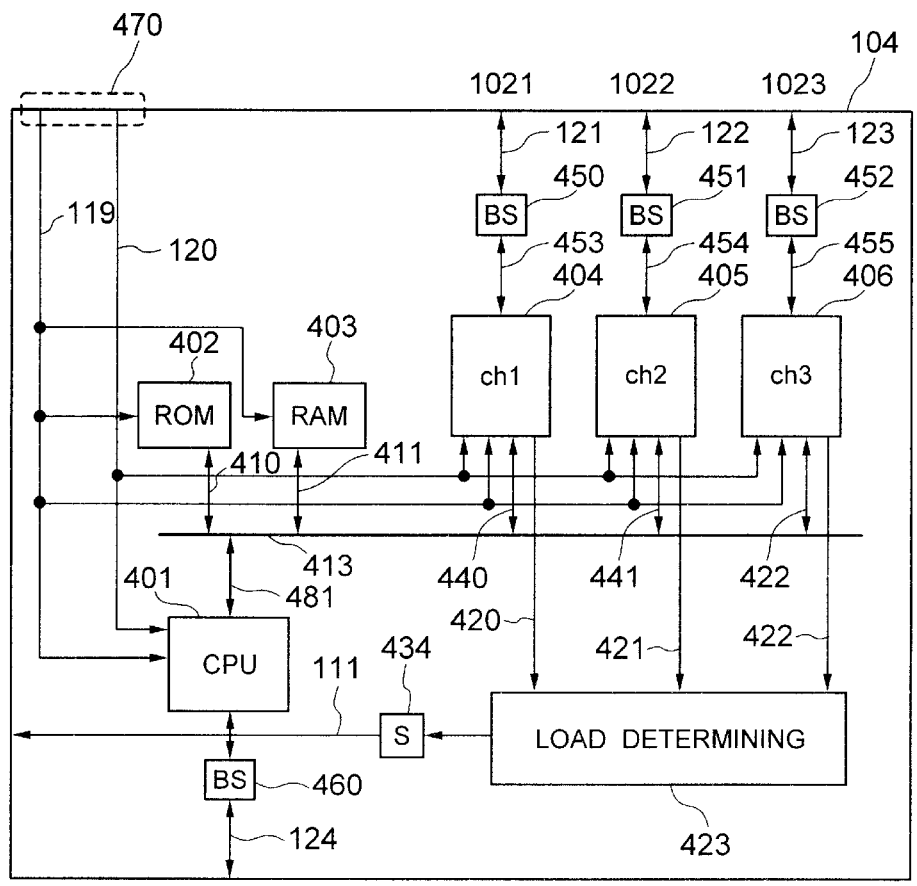
FIGS. 4A and 4B are block diagrams showing the structure of a communication processor shown in FIG. 1.
Figure 4B:
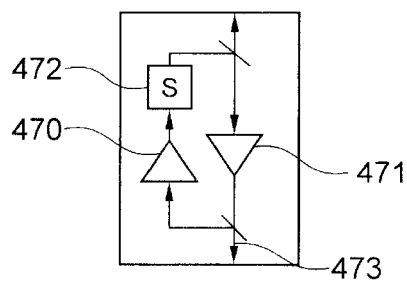

FIGS. 4A and 4B show an example of the structure of the communication processor 104 shown in FIG. 1.

In FIG. 4, reference numeral 401 represents a central processing unit (CPU), 402 represents a read only memory (ROM), 403 represents a random access memory (RAM), 404 to 406 represent communication circuits, 423 represents a load determining circuit, 472 represents a level shifter, 460, 450 to 452 represent bidirectional level shifters, 470 represents a consumption power control interface, 119 represents a power line, and 120 represents a clock signal line.

CPU 401 accesses ROM 402 and RAM 403, reads a program and reads/writes data to perform information processing. CPU 401 writes data in a register in the load determining circuit to set conditions via a signal line 481.

The communication circuit 404 receives information from a microcomputer of the elevator via a signal line 121.

The communication circuits 405 and 406 operate in a manner similar to the communication circuit 404.

The load determining circuit 423 receives information from signal lines 420, 421 and 422, judges the total load status of the communication processor 104, and outputs the judgement result to a signal line 111 as a performance improvement request signal. More specifically, if a reception or transmission operation is performed via all the three-channel signal lines 420, 421 and 422 at the same time, it is judged that the load is high, and "1" is output to the signal line 111, and in other cases, "0" is output. The conditions that the load determining circuit judges as a high load can be changed. The judgement conditions (the number of channels) are set to the register in the load determining circuit.

FIG. 4B shows the structure of the bidirectional level shifter 460. Reference numerals 470 and 471 represent buffers, and 472 represents a level shifter.

A signal input from a signal line 473 is passed to the buffer 470 and level shifter 472 to raise the signal amplitude to the level on the output side (on the side of the signal line 124 shown in FIG. 4A) and output it. In this embodiment, it is assumed that the input side is 1.8 V or 3.3 V and the output side is 5 V.

The bidirectional level shifters in this specification embodiment have all the same structure as that shown in FIG. 4B.

Figure 5:
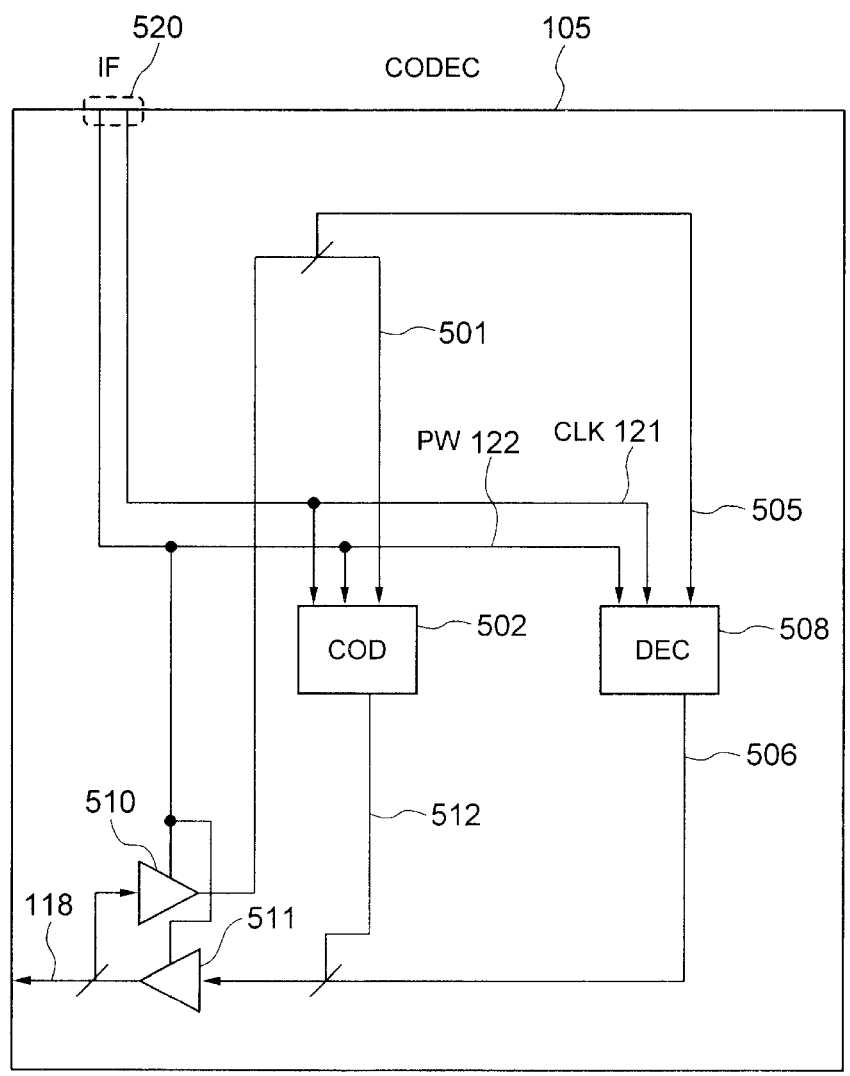
FIG. 5 is a diagram showing the structure of a CODEC processor shown in FIG. 1.

FIG. 5 is a diagram showing the structure of the CODEC processor 105 shown in FIG. 1.

In FIG. 5, reference numeral 502 represents a coding circuit, 508 represents a decoding circuit, 121 represents a clock signal line, 122 represents a power line, 510 and 511 represent buffers, and 520 represents a consumption power control interface.

The coding circuit 502 decodes data before coding supplied from a signal line 501 and outputs coded data to a signal line 512.

The decoding circuit 508 receives data before decoding supplied from a signal line 505 and outputs decoded data to a signal line 506.

In this embodiment, it is assumed that error correction codes are used as codes.

Since the CODEC processor 105 operates at the same voltage as that of the buffer processor 103, a level shifter circuit is not used at each signal line.

Figure 14A:
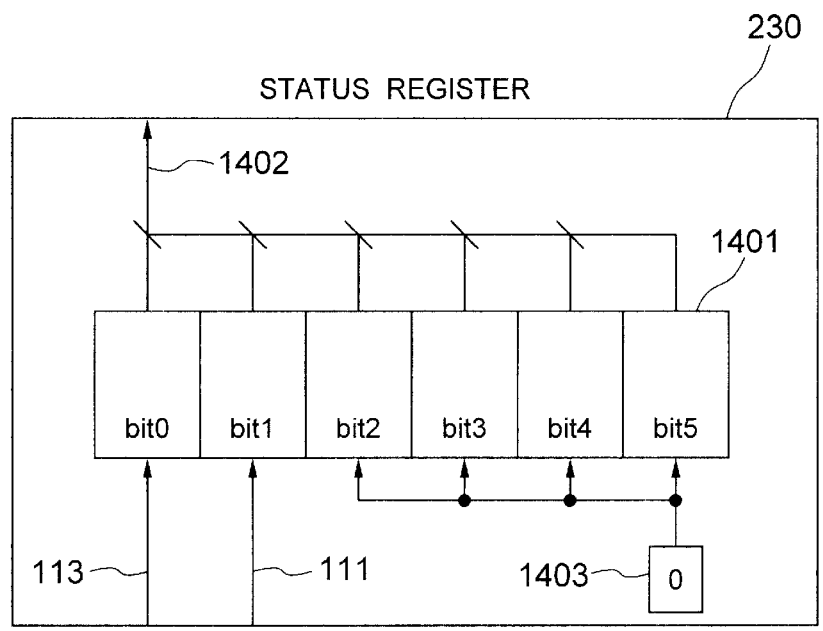
FIGS. 14A and 14B are circuit diagrams showing the structure of a register 230 shown in FIG. 2.
Figure 14B:
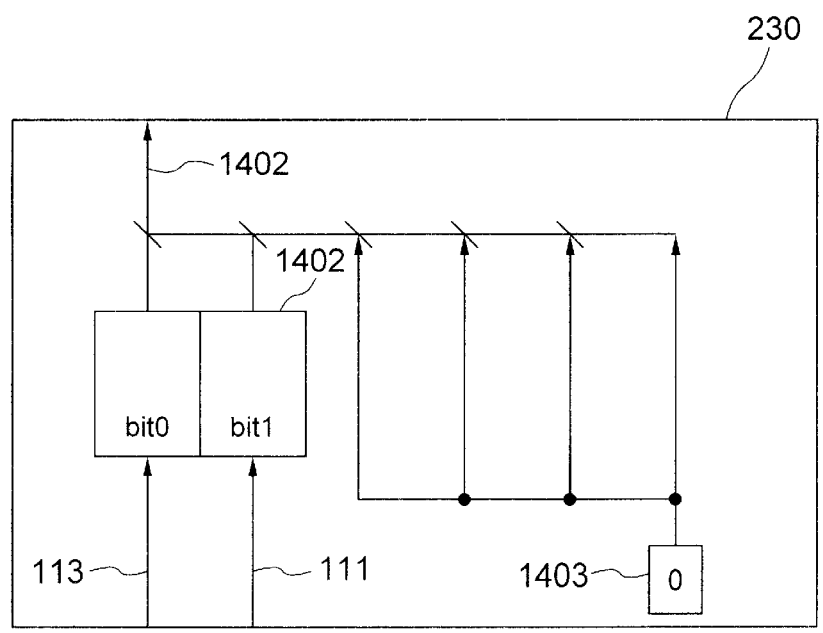

FIGS. 14A and 14B show the structure of the consumption power request status register 230.

In FIG. 14, reference numeral 1401 represents a 6-bit register, and 1403 represents a constant output circuit.

The register 1401 is a 6-bit register, and each bit is constituted of a flip-flop capable of being set and reset upon signal input. The logical value "1" of each bit for loading a performance improvement request of an IP core of the system LSI indicates that there is a performance improvement request, whereas the logical value "0" indicates that there is no performance improvement request.

The constant output circuit 1403 continues to output "0" to the bit positions 2 to 5 of the register 1401. In FIG. 14A, the bit positions 2 to 5 are not used. The connections between the constant output circuit continuing to output "0" to the bit positions not in use and the register inputs for the constant output circuit are automatically generated from the input specification at the core specification selection process 2502. Instead of automatically generating the constant output circuit, a circuit with the register portion not shown being deleted may be used as shown in FIG. 14B.

Figure 15:
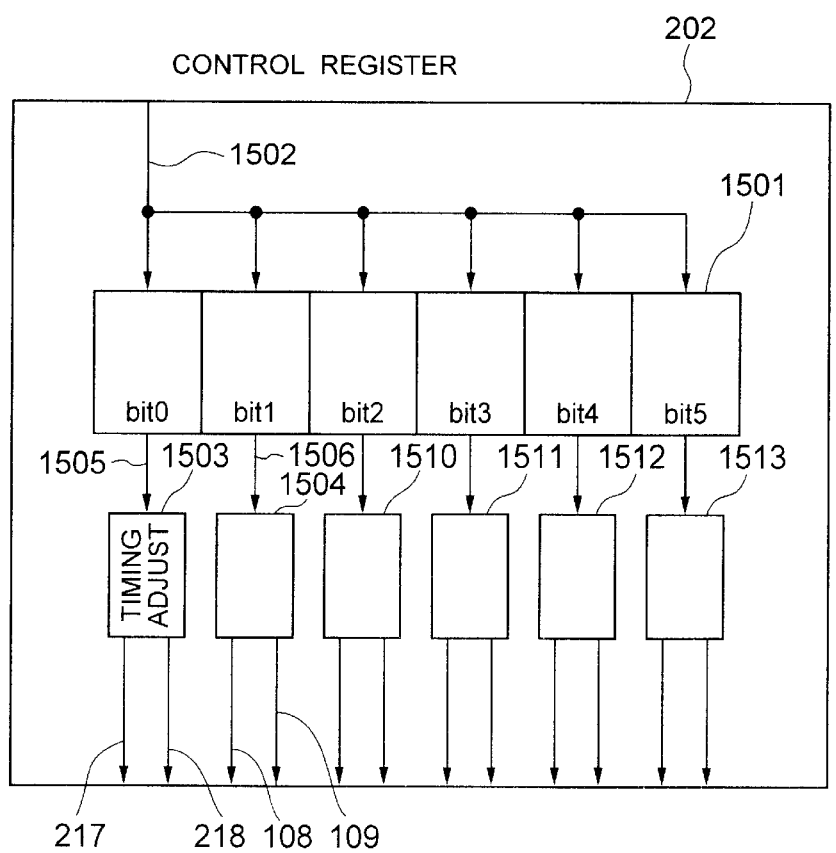
FIG. 15 is a block circuit showing the structure of a register 202 shown in FIG. 2.

FIG. 15 shows the structure of the consumption power control register 202.

In FIG. 15, reference numeral 1501 represents a 6-bit register, and 1503, 1504 and 1510 to 1513 represent timing adjusting circuits.

The register 1501 is a 6-bit register, and each bit is constituted of a flip-flop capable of being set and reset upon signal input. The logical value "1" of each bit for loading the operation status of an IP core of the system LSI indicates an operation under a large consumption power (high performance) mode, whereas the logical value "0" indicates an operation under a small consumption power (low performance) mode. In this embodiment, the bit position 0 corresponds to the buffer processor 103 and the bit position 1 corresponds to the communication processor 104. In FIG. 15, the bit positions 2 to 5 are not used so that timing adjusting circuits 1510 to 1513 are not used.

The operation of the timing adjusting circuit 1503 will be described with reference to FIG. 19.

Figure 19:
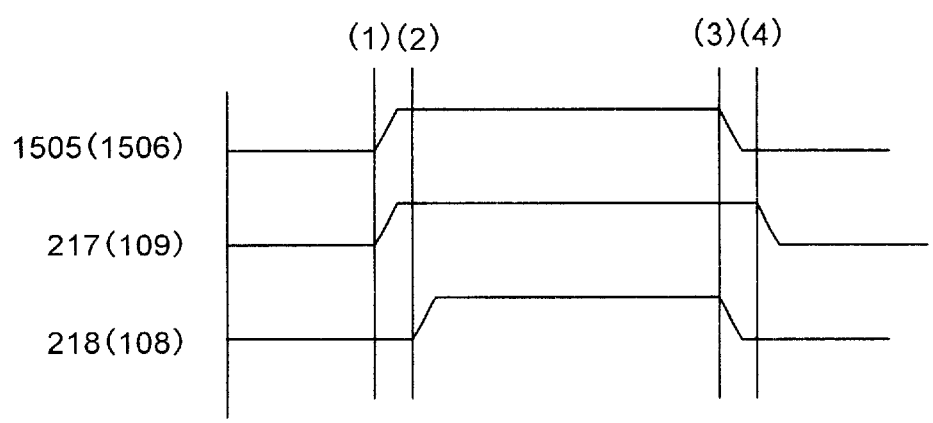
FIG. 19 is a diagram showing waveforms illustrating an operation of a timing adjuster circuit 1503.

When a signal on a signal line 1505 rises from "0" to "1" indicated at (1) in FIG. 19, a signal line 217 rises from "0" to "1" approximately at the same time and a signal line 218 rises at (2) after a delay of several clock periods. When the signal on the signal line 1505 falls from "1" to "0" at (3) indicated in FIG. 19, the signal line 218 falls from "1" to "0" approximately at the same time and the signal line 217 falls at (4) after a delay of several clock periods. If the system LSI operates at a high clock frequency, a higher supply voltage is necessary. Therefore, the power control and clock frequency control are executed at the timings described above.

Figure 17:
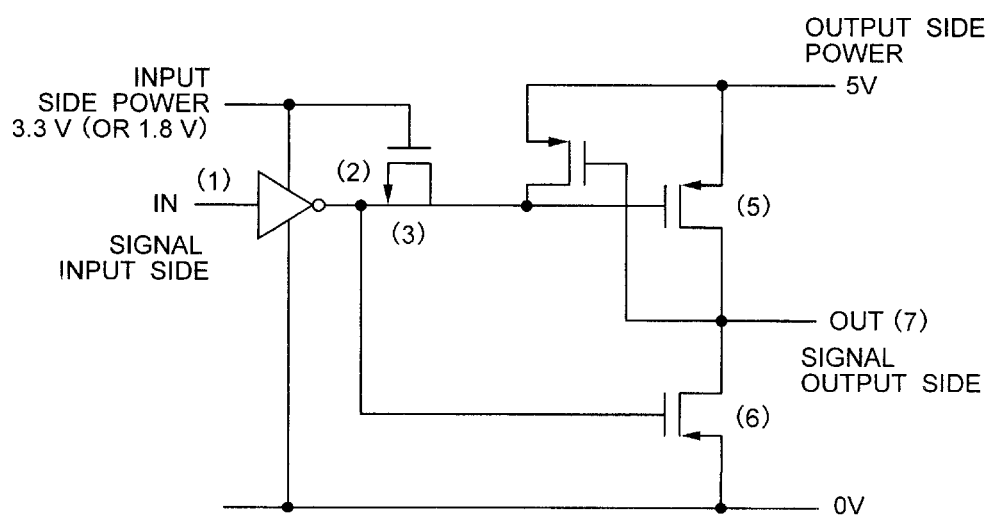
FIG. 17 is a circuit diagram showing the structure of a voltage level shifter shown in FIG. 2.

FIG. 17 shows an example of the structure of the voltage level shifter circuit 241 shown in FIG. 2.

When a signal of High level is input to a node (1), a node (2) becomes Low, current flows from right to left at a node (3), a node (5) turns on, a node (6) turns off, and a signal output side node (7) becomes High.

When a signal of Low level is input to the node (1), the node (2) becomes High, the node (3) turns off, the node (5) turns off, the node (6) turns on, and the signal output side node (7) becomes Low.

Figure 27A:
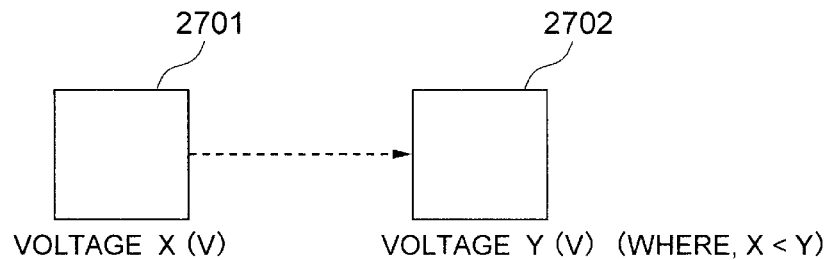
FIGS. 27A to 27C are schematic diagrams illustrating the case that a voltage level shifter is required.
Figure 27B:
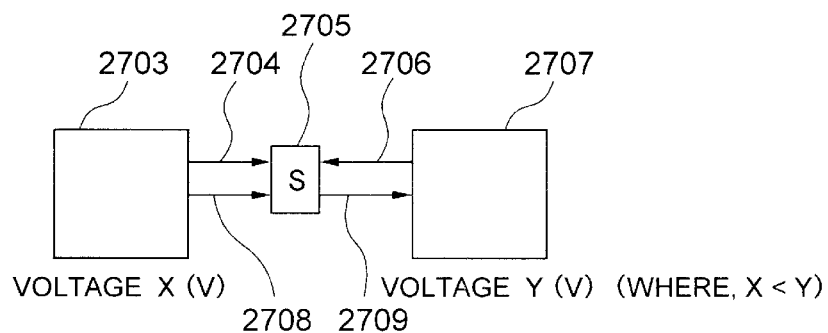
Figure 27C:
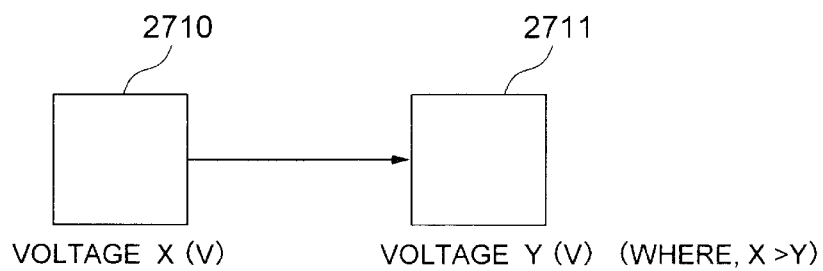

If the operation voltage is higher on the signal output side than on the signal input side (FIG. 27A), a level shifter circuit such as shown in FIG. 17 is required (FIG. 27B). In FIG. 27B, reference numeral 2704 represents an input side power line, 2708 represents an input side signal line, 2706 represents an output side power line, and 2709 represents an output side signal line. If the relation between voltages is reversed, the voltage level shifter circuit is not required if the logical thresholds of an input stage circuit and a last stage circuit are set equal and the input breakdown voltage (breakdown capability of the input signal voltage) is ensured.

Figure 16:
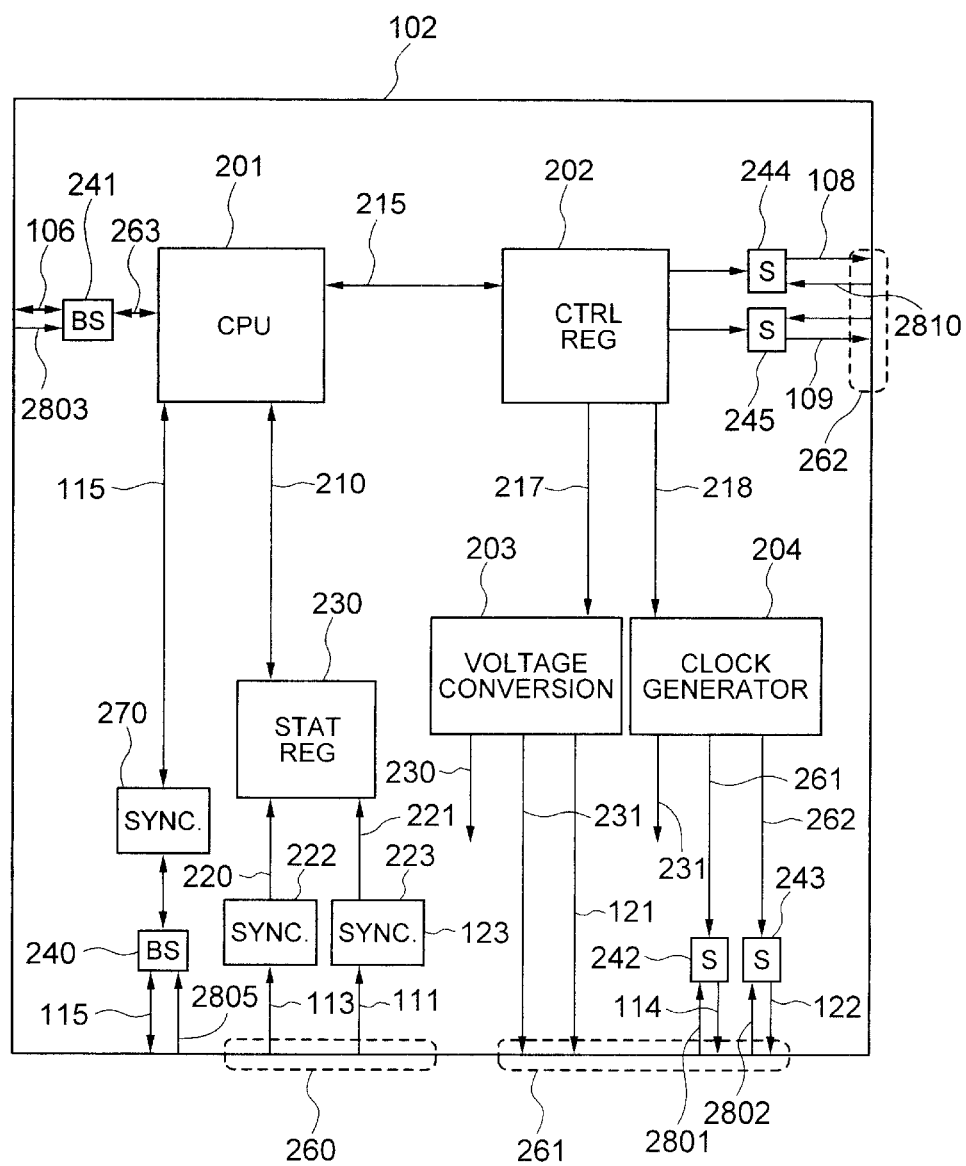
FIG. 16 is a block diagram added with an output side power input to the main processor shown in FIG. 2.

The above case is applicable also to other voltage level shifter circuits of the embodiment other than the voltage level shifter circuit 241. In this embodiment, the input side power input (1.8 V or 3.3 V) and the output side power input (5 V) are not shown. In FIG. 16, the output side power inputs are not omitted although they are omitted in FIG. 2. In FIG. 16, reference numerals 2810, 2811, 2801, 2802, and 2805 represent output side power inputs. The input side power inputs are assumed to be supplied from the power line 230.

The operation of the bidirectional voltage level shifter has been described with reference to FIG. 4B.

Figure 18:
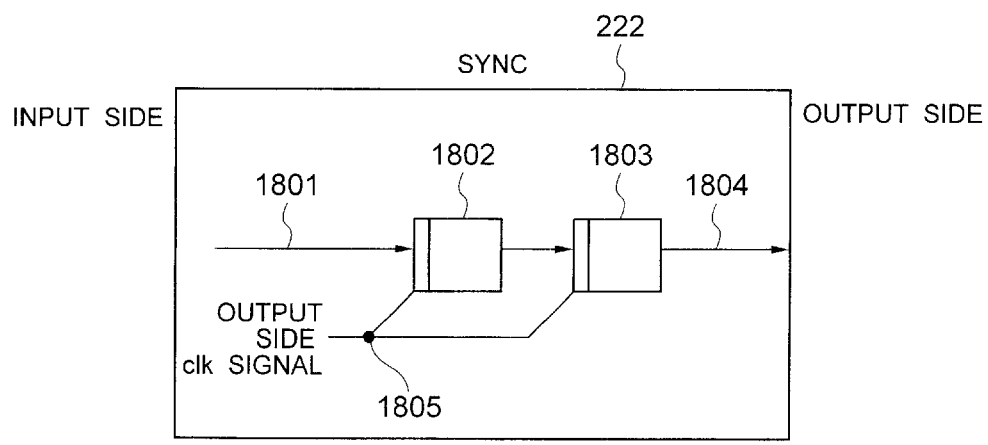
FIG. 18 is a circuit diagram showing the structure of a synchronization circuit shown in FIG. 2.

FIG. 18 shows the circuit structure of the synchronization circuit 222.

In FIG. 18, reference numerals 1802 and 1803 represent flip-flops, and 1805 represents a clock signal line in the IP core.

The synchronization circuit 222 receives a signal from a signal line 1801, the signal changing synchronously with a clock on the side of an external core signal (a signal output from another core), and outputs the signal to a signal line 1804 via two flip-flops. Since the input signal to the flip-flop 1802 is a signal changing synchronously with the clock signal of another core, there is a possibility that the signal on the signal line 1801 changes approximately at the same time with a change in the internal core clock signal. In such a case, it is know that it takes a longer time (one clock or shorter of the output side clock) than usual until the output signal of the flip-flop 1802 is established. Therefore, if the signal of the flip-flop 1802 itself is used in another logic circuit, it becomes easy for the delay value between flip-flops to exceed the (output side) clock period, which contradicts the restriction of a synchronous circuit generally using a delay value shorter than one clock between flip-flops. From this reason, the signal output from the flip-flop 1802 is immediately supplied to the flip-flop 1803 to synchronize it.

As in this embodiment, for example, if the main processor 102 supplies the clock signal to the buffer processor 103, this clock signal for the buffer processor 103 can be controlled by the main processor 102. It is therefore conceivable that the clock signal of the circuit 102 is controlled so as not to use the synchronization circuit shown in FIG. 18.

Next, examples of the operation of the system will be described with reference to FIGS. 8 and 9.

Figure 8:
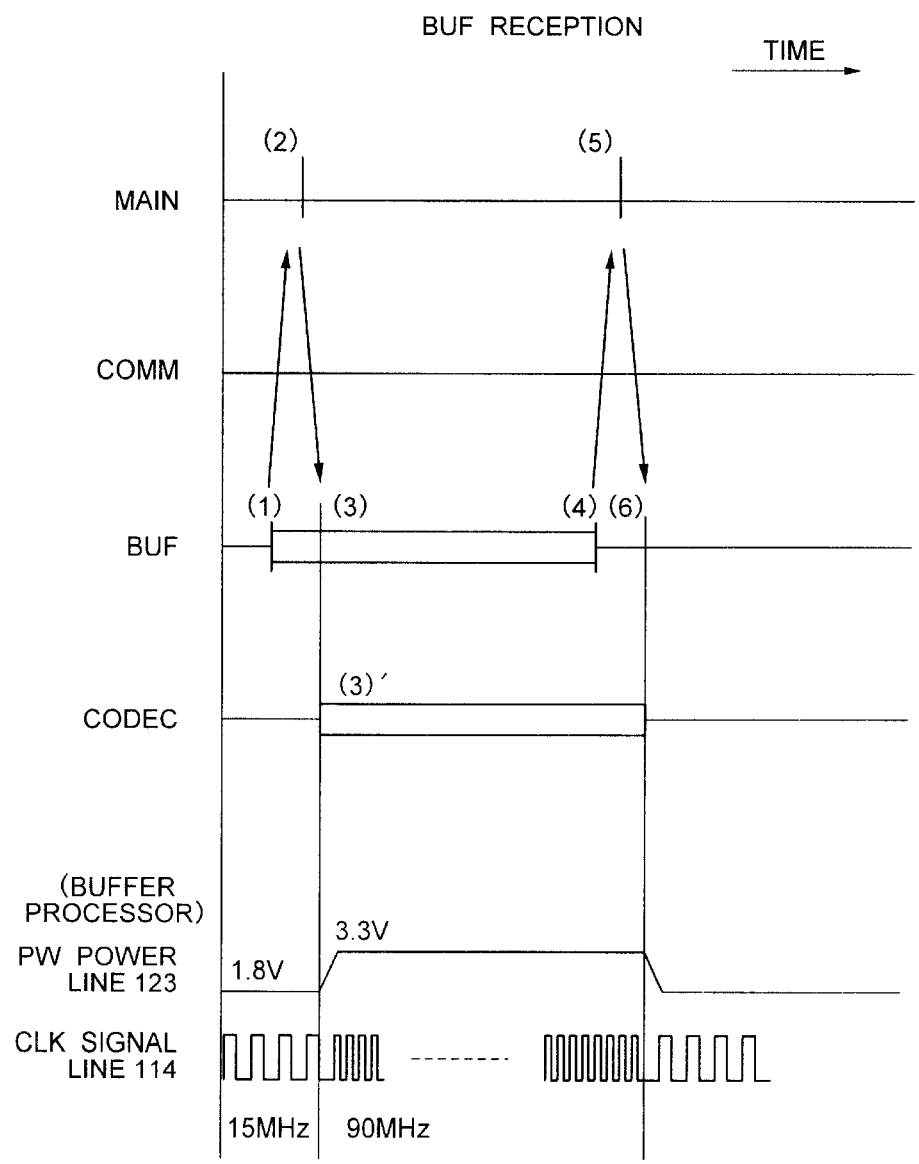
FIG. 8 is a timing chart illustrating an example of a first operation of a system.

FIG. 8 is a timing chart illustrating a first example of the operation of the system in which a data reception operation is performed via the signal line 117.

First, of the data reception operation, a data reception start operation will be described.

The buffer processor 103 starts receiving data at a timing (1) shown in FIG. 8. As the received data is loaded in FIFO 306, the signal on the signal line 322 changes from "0" to "1". The initial values of the signals on the signal lines 320 to 323 are "0". When the signal on the signal line 322 changes to "1", the signal on the signal line 113 changes from "0" to "1". This signal is used as the request signal (performance improvement request) for requesting the main processor 102 to increase the consumption power. Upon reception of a signal change on the signal line 113 from "0" to "1", the main processor 102 sets "1" to the register 230 at the bit position 0 (at a timing (2) in FIG. 8). The bit position 0 is used for the buffer processor and the bit position 1 is used for the communication processor. This assignment is realized by connecting the signal line 113 to the bit position 0 and the signal line 111 to the bit position 1, and is recognized by software executed by CPU 201. When "1" is set to the bit position 0 of the register 230, i.e., the bit position 0 of the register 1401, the software executed by CPU 201 periodically reads the value of the register 230 so that a performance improvement request from the buffer processor 103 can be recognized. When CPU 201 recognizes the performance improvement request from the buffer processor 103, it sets "1" to a performance improvement setting register for the buffer processor 103 in the control register 202. When the value of the performance improvement setting register for the buffer processor 103 in the control register 202 changes from "0" to "1", a change request to change the operation voltage and frequency is issued from the timing adjusting circuit 1503 to the power circuit, i.e., voltage conversion circuit 203 and to the clock generator circuit 204. When the consumption power is to be increased (when the performance is to be improved), the supply voltage is raised and thereafter the clock frequency is raised (at a timing (3) in FIG. 8). Similarly, the supply voltage and clock frequency of the CODEC processor 105 are also raised (at a timing (3') in FIG. 8). This is because the configuration of the system LSI requires to improve the performance of the CODEC processor 105 by using the data received at the buffer processor 103. This can be realized by creating software of the system LSI so as to improve the operation performance of the CODEC processor 105 when the operation performance of the buffer processor 103 is improved.

In order to avoid any problem to be caused by a difference of the operation speed between both the processors, the software executed by the main processor 101 performs a proper process, for example, inserting an operation wait when the faster operation side accesses the slower operation side.

Next, of the data reception operation, a data reception completion operation will be described.

It is assumed that the data reception by the buffer processor 103 is completed at a timing (4) in FIG. 8. In this case, there is no reception data in FIFO 306 so that the signal on the signal line 322 changes from "1" to "0". If FIFO 301 is also empty, then performance improvement request on the signal line 113 is discarded, whereas if not, the performance improvement request is discarded when FIFO 301 becomes empty. When the performance improvement request is discarded, the bit position 0 of the register 230 is reset so that the clock frequency and supply voltage supplied to the buffer processor 103 are lowered. This also occurs in the CODEC processor 105. Generally, if the clock signal is changed in the clock generator circuit, it is necessary to have a short time period until the changed clock signal is output. In this embodiment, the system operation is stable during this short time period.

Next, with reference to FIG. 9 and FIG. 4A, a second example of the operation when the communication processor 104 receives data from the signal lines 121 to 123, will be described.

First, of the data reception operation, a data reception start operation will be described.

Figure 9:
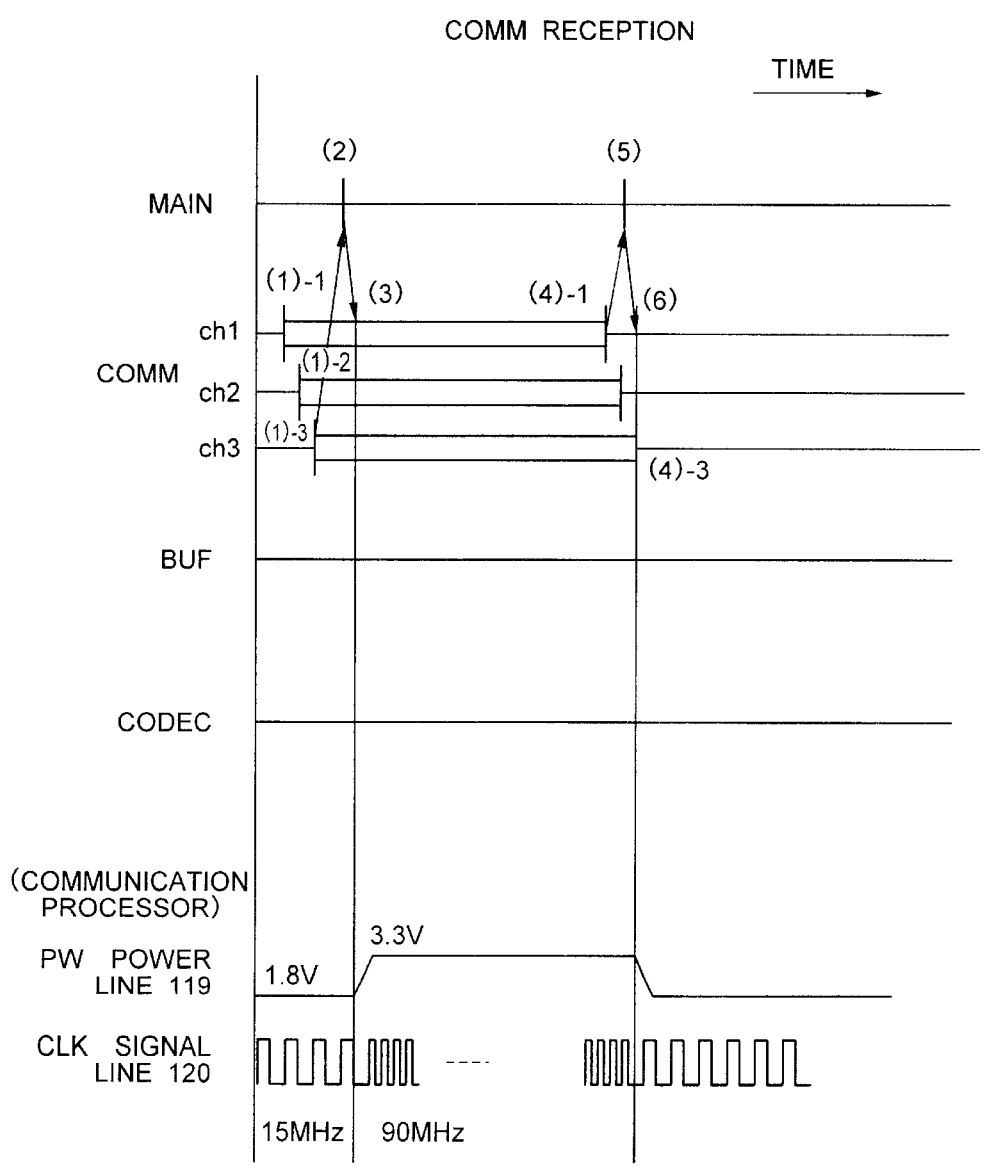
FIG. 9 is a timing chart illustrating an example of a second operation of a system.

The communication processor 104 starts receiving data from the signal lines 121, 122 and 123 at timings (1)-1, (1)-2 and (1)-3 shown in FIG. 9, respectively. At these timings, the operations of the communication circuits 404, 405 and 406 start. CPU 401 judges the type of the data received by the three communication circuits, performs necessary information processing, and sends data important to the elevator to be controlled to the main processor 102. From the viewpoint of the process performance of CPU 401, in the low consumption power operation mode, CPU 401 can deal with one or two communication circuits at the same time, whereas CPU can deal with three communication circuits as the same time only in the high performance process mode. Therefore, at the timing (1)-3, the load determining circuit 423 judges as a high load and outputs a signal "1" to the signal line 111. Upon reception of this signal "1" on the signal line 111, the main processor 102 sets "1" to the status register 230 at the register bit position 1 for the communication processor. The software executed by CPU 201 recognizes a request to increase the consumption power (to improve the performance) of the communication processor 104, and "1" is set to the bit position 1 of the control register 202 for the communication processor. Therefore, the signal on the signal line 109 changes from "0" to "1" and thereafter the signal on the signal line 108 changes from "0" to "1". The signal on the signal line 109 designates the operation voltage of the communication processor 104, and the signal on the signal line 108 designates the operation frequency of the communication processor 104. When the main processor 102 recognizes a change in the signal on the signal line 111 from "0" to "1", it sets "1" to the register 202 at the bit position for the communication processor. Therefore, the timing adjustor circuit 1504 issues a request to change the operation voltage and operation frequency to the power circuit 131 and clock generator circuit 130. If the consumption power is to be increased (if the performance is to be improved), the supply voltage is raised and thereafter the clock frequency is raised (at a timing (3) in FIG. 9).

Next, of the data reception operation, a data reception completion operation will be described.

It is assumed that the data receptions at ch1, ch2 and ch3 are completed at timings (4)-1, (4)-2 and (4)-3 in FIG. 9, respectively. In this case, there is no process load in the communication circuits 404, 405 and 406. When there is no process load of the communication circuit 404, the load determining circuit 423 changes the signal on the signal line 111 to "0" which means that the performance improvement request of the communication circuit 104 was discarded. When the performance improvement request signal is discarded, CPU 401 recognizes it at a timing (5) and resets the bit position 1 of the register 230 so that the clock frequency and supply voltage supplied to the communication processor 104 are lowered at a timing (6).

The first embodiment of the invention has been described above.

Next, a second embodiment of the invention will be described with reference to FIGS. 10 to 13 and FIGS. 23 and 24.

Figure 23:
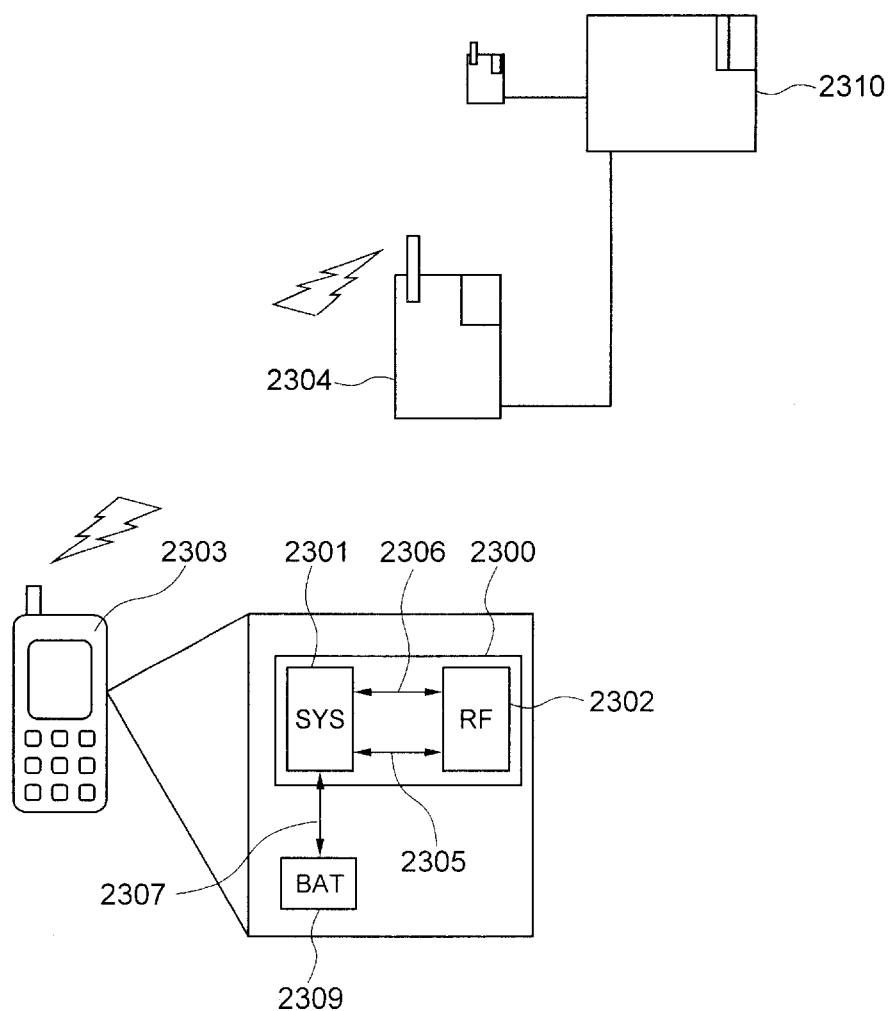
FIG. 23 is a schematic diagram illustrating how the system of the second embodiment of the invention is used.

FIG. 23 shows how a system embodying the invention is used.

Reference numeral 2300 represents a system-in-package (SIP) chip, 2301 represents a system chip in the package, 2302 represents a radio frequency (RF) module, 2303 represents a portable terminal, reference numeral 2304 represents a base station for portable terminals, 2307 and 2308 represent consumption power control interfaces, 2305 represents a signal line for consumption power control, 2306 represents a signal line for RF module control, 2309 represents a battery, 2308 represents a signal line for battery control, and 2310 represents a central server.

SIP 2300 is constituted of the system chip 2301 and RF module 2302. SIP 2300 is built in the system portable terminal 2303.

The system chip 2301 includes a main processor, a battery monitor processor, a buffer processor, and a CODEC processor.

The RF module 2302 includes a circuit for wireless communications with the portable terminal 2303, and is controlled by the system chip 2301 via the signal lines 2305 and 2306.

The portable terminal 2303 has one display screen, a plurality of input buttons, and a voice input/output means (not shown), and has a function of speech communications with other portable terminals, portable telephones and general fixed telephone with the involvement of the base station 2304. The portable terminal 2303 can be distributed with moving image information and voice information from the server via the base station 2304. The portable terminal 2303 has a function of transmitting an "insufficient battery capacity signal" to the base station 2304 immediately before the power-off by an insufficient battery capacity.

The base station 2304 supports the speech communication function of the portable terminal with other terminals and telephones, and has a function of information distribution to portable terminals. The base station 2304 has a function of receiving the "insufficient battery capacity signal" transmitted from the portable terminal 2303 and notifying it to the central server 2310.

The central server 2310 has a role of interconnecting base stations and another function that after the insufficient battery capacity signal supplied from the portable terminal 2203 is received, if a speech connection request to the portable terminal 2303 is received and connection to the portable terminal 2303 cannot be established, an insufficient battery capacity message "called telephone may have an insufficient battery capacity now" is sent back to the speech connection requester.

Figure 10:
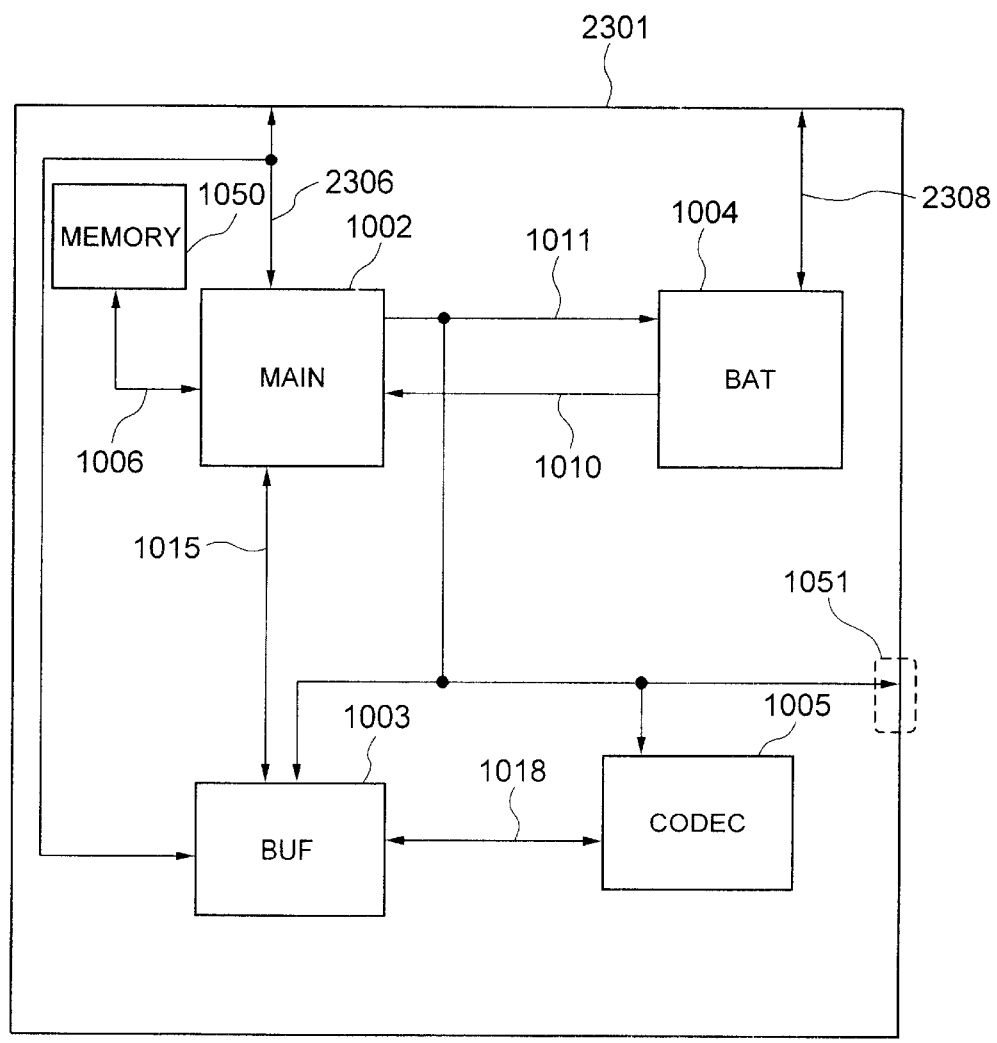
FIG. 10 is a block diagram showing the structure of a system LSI according to a second embodiment of the invention.

FIG. 10 shows the structure of a circuit of the system chip 2301.

In FIG. 10, reference numeral 1050 represents a memory, 1002 represents a main processor, 1004 represents a battery monitor circuit, 1003 represents a buffer processor, 1005 represents a coding/decoding (CODEC) processor, and 1051 represents a consumption power control interface.

The main processor 1002 accesses the memory to read a program or data to perform the process, and transfers data to and from the buffer processor 1003 via a signal line 1015. The main processor 1002 receives information on the remaining battery capacity via a signal line 1010, and instructs the buffer processor 1003 and CODEC processor 1005 via a signal line 1011 to enter a forced low consumption power mode. This mode is an operation mode which is entered when the remaining battery capacity is small. The main processor 1002 controls the RF module 2302 via a signal line 2306.

The battery monitor circuit 1004 outputs remaining battery capacity information to the signal line 1010 and monitors a voltage on a power line 2305 to calculate the remaining battery capacity.

The CODEC processor 1005 encodes and decodes data received at the buffer processor 1003.

The buffer processor 1003 receives data received at the RF module via a signal line 2306, and receives data output from the main processor 1002 via the signal line 1015.

Figure 11:
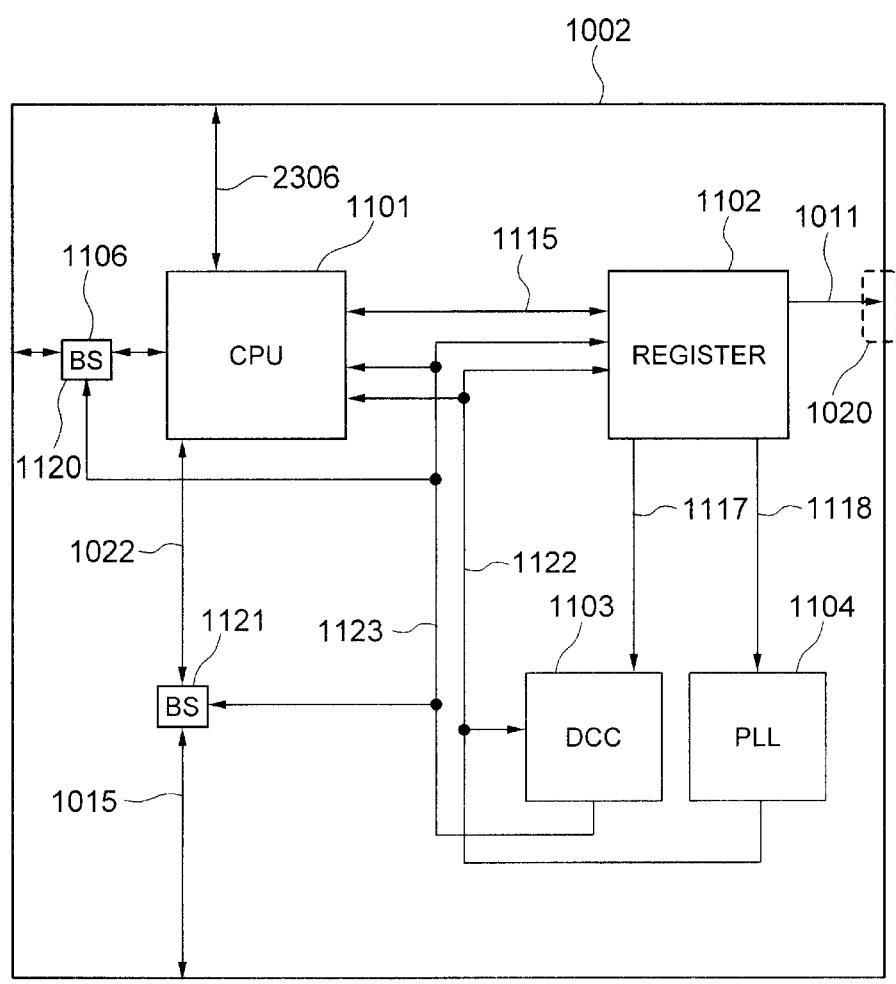
FIG. 11 is a block diagram showing the structure of a main processor shown in FIG. 10.

FIG. 11 shows the structure of the circuit of the main processor 1002.

In FIG. 11, reference numeral 1101 represents a central processing unit (CPU), 1102 represents a register, 1103 represents a power circuit, 1104 represents a clock generator circuit, and 1106 and 1121 represent bidirectional level shifters.

CPU 1101 controls the RF module 2302 via the signal line 2306 and controls the whole of the portable terminal 2303 by using the memory 1050.

The register 1102 is a 3-bit register made of three flip-flops which are set or reset upon instruction from CPU via a signal line 1115. The register 1102 forms signals for controlling the power circuit 1103 and clock generator circuit 1104, and outputs a signal to the signal line 1011.

The power circuit 1103 supplies power to each circuit in the main processor 1002. In accordance with an instruction from a signal line 1117, the power circuit 1103 can selectively output 3.3 V and 1.8 V.

The clock generator circuit 1104 supplies a clock signal to each circuit in the main processor 1002 which requires clocks. In accordance with an instruction from a signal line 1118, the clock generator circuit 1104 can selectively output clock signals having frequencies of 15 MHz and 90 MHz.

The bidirectional level shifter 1106 performs amplitude conversion of a signal between the voltage (5 V) outside the main processor and the voltage (3.3 V or 1.8 V) inside the main processor.

Figure 12:
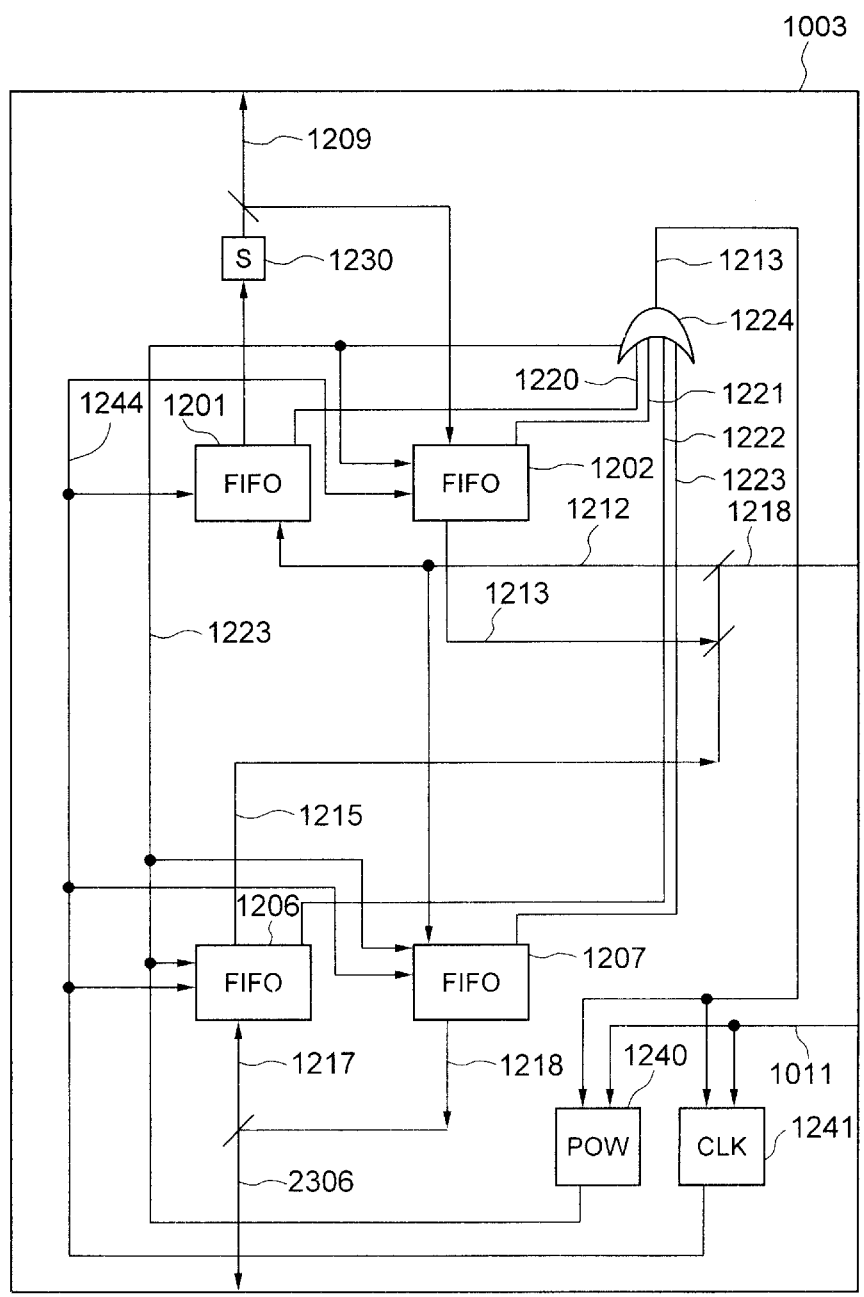
FIG. 12 is a block diagram showing the structure of a communication processor shown in FIG. 10.

FIG. 12 shows the structure of the circuit of the buffer processor 1003.

In FIG. 12, reference numeral 1230 represents a level shifter, 1201, 1202, 1206 and 1207 represent first in first out (FIFO) buffers, 1224 represents an OR gate, 1240 represents a power circuit, and 1241 represents a clock generator circuit.

The FIFO buffers 1201, 1202, 1206 and 1207 are used for decoding data received over communications and supplying it to the main processor 1101 and for encoding data supplied from the main processor 1101. Each FIFO buffer outputs a busy signal to each of signal lines 1220 to 1223.

The OR gate 1224 obtains an OR (logical sum) of data input via the signal lines and outputs the results to a signal line 1213.

The power circuit 1240 supplies power to each circuit in the buffer processor 1003. The power circuit 1240 receives a performance improvement request signal from a signal line 1213, and if this signal is "1", raises the supply voltage (1.8 V→3.3 V). However, if the signal on the signal line 1011 is "1", the forced low consumption power mode is assumed and the supply voltage is not raised.

The clock generator circuit 1241 supplies a clock signal to each circuit in the buffer processor 1003 which requires clocks. The clock generator circuit 1241 receives a performance improvement request signal from a signal line 1213, and if this signal is "1", raises the clock frequency (15 MHz→90 MHz). However, if the signal on the signal line 1011 is "1", the forced low consumption power mode is assumed and the clock frequency is not raised.

Figure 13:
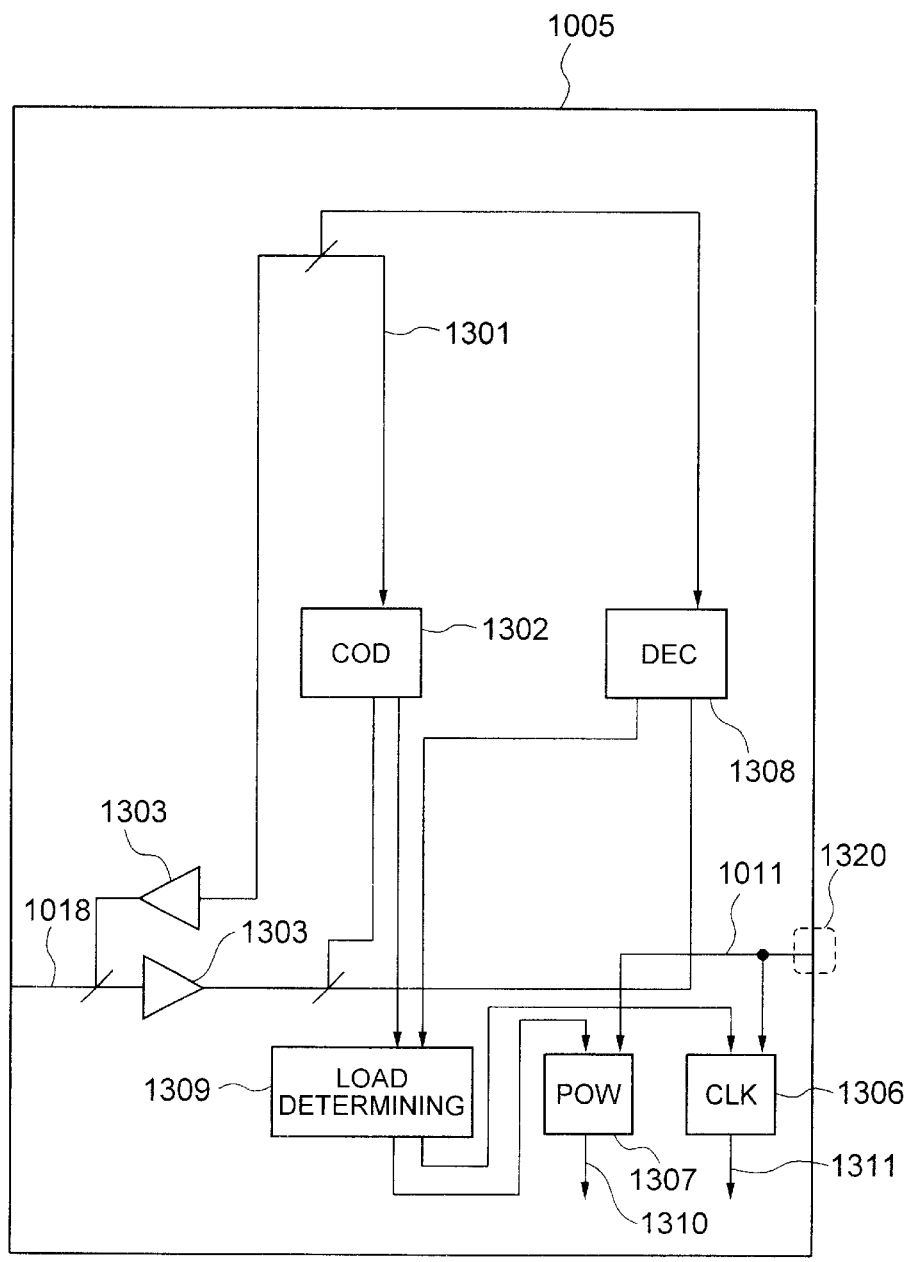
FIG. 13 is a diagram showing the structure of a buffer processor shown in FIG. 10.

FIG. 13 shows the structure of a circuit of the CODEC processor 1005.

In FIG. 13, reference numeral 1302 represents a coding circuit, 1303 represents an amplifier, 1308 represents a decoding circuit, 1309 represents a load determining circuit, 1007 represents a power circuit, 1306 represents a clock generator circuit, and 1320 represents a consumption power control interface.

The coding circuit 1302 performs a coding process for data to be transmitted.

The decoding circuit 1308 performs a decoding process for received data.

The load determining circuit 1309 judges the load of the coding circuit 1302 and decoding circuit 1308, and if the load is large, issues a performance improvement request to the power circuit 1307 and clock generator circuit 1306.

The power circuit 1307 supplies power 1310 to the inside of the CODEC processor 1005, and if there is a performance improvement request from the load determining circuit 1309, raises the supply voltage (1.8 V→3.3 V). However, if the signal on the signal line 1011 is "1", the forced low consumption power mode is assumed and the supply voltage is not raised.

The clock generator circuit 1306 supplies a clock signal 1311 to the inside of the CODEC processor 1005, and if there is a performance improvement request from the load determining circuit 1309, raises the clock frequency (15 MHz→90 MHz). However, if the signal on the signal line 1011 is "1", the forced low consumption power mode is assumed and the clock frequency is not raised.

Figure 24:
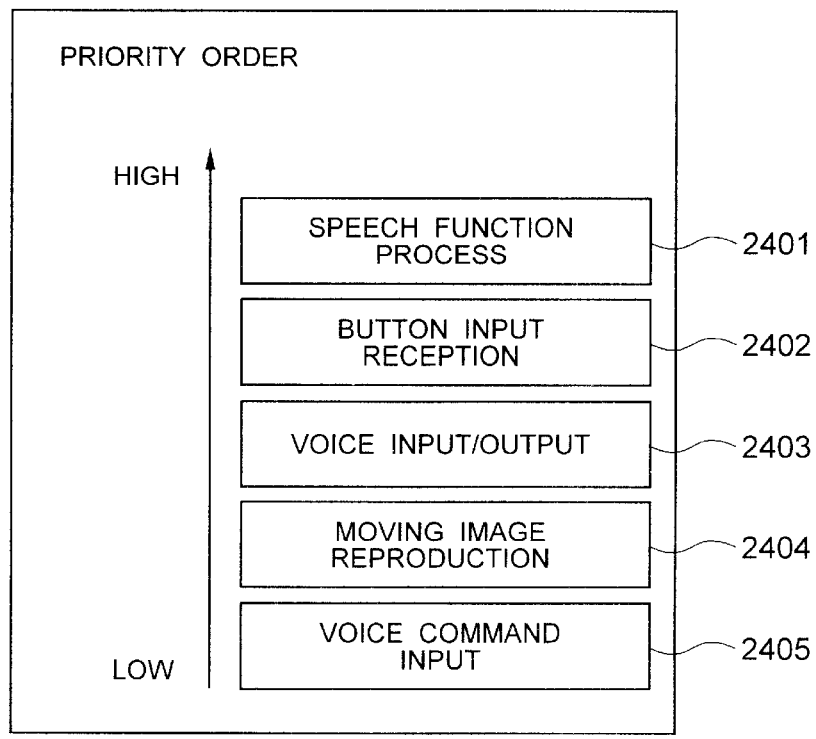
FIG. 24 is a schematic diagram illustrating software to be executed by a processor of SIP 2300 of the second embodiment.

With reference to FIG. 24, software running on the main processor of SIP 2300 of the second embodiment will be described.

FIG. 24 shows five processes to be executed in the portable terminal 2303 in the priority order.

A communication control process 2401 is a process of decoding data received at the RF module and encoding data to be transmitted from the portable terminal.

A button input reception process 2402 is a response process to a depression of a button of the portable terminal 2303 by a user.

A voice input/output process 2403 is a process of realizing a function of a portable telephone of the portable terminal and outputting received voice data from a voice output device of the portable terminal 2303.

A moving image reproduction process 2403 is a process of reproducing moving image data received by the portable terminal 2303 on a display device of the portable terminal.

A voice command input process 2404 is a process of analyzing and executing a command input from a microphone built in the portable terminal 2303 by voices of the user. By using a voice command, an operation equivalent to a button input can be performed.

These processes have a priority order as shown in FIG. 24. In the case of a "sufficient remaining battery capacity", all the processes shown in FIG. 24 are executed. However, in the case of a "small remaining battery capacity", the communication control process 2401, button input process 2402 and voice input/output process 2403 only are executed.

In this embodiment, as the battery status, only two cases "sufficient remaining battery capacity" and "small remaining battery capacity" are described. However, an intermediate battery status between the above two cases may also be monitored by the battery monitor circuit so that a judgement of which processes are to be executed with the priority over other processes of the software can be made flexibly.

The first and second embodiments have been described above. In the first embodiment, the system LSI has therein a master module which controls the consumption power and performance of other modules. In the second embodiment, each module in the system LSI has the power circuit and clock generator circuit and each module independently controls the consumption power and performance. In the former, modules other than the master module are not required to have the power circuit and clock generator. Therefore, the number of design steps for modules (IP) other than the master module can be reduced, and power lines and signal lines can be designed generally in the same manner when a system LSI is designed so that the number of design steps of the system LSI can be reduced. In the latter, since the consumption power and performance are controlled independently in each module, a designer of each IP core can study and implement a method of lowering a consumption power specific to the core. Furthermore, there is a merit that the number of signals to be transferred between IP cores for the consumption power control can be reduced more than the first embodiment.

According to the invention, hardware resources such as interfaces and registers for the consumption power control of other IP cores are prepared and controlled by software for the consumption power control of a system LSI. Since a voltage shift circuit is provided in the interface of a circuit module for changing the voltage, it becomes possible to change the supply voltage of only some circuit modules to operate the modules at the changed voltage.

What is claimed is:

1. A logic circuit module comprising:
   a built-in main processor;
   an interface for consumption power control;
   a function controlling a consumption power of another logic circuit module having a built-in main processor;
   a power circuit for the other logic circuit module; and
   a clock generator circuit for the other logic circuit,
   wherein the other logic circuit includes an interface for outputting a request of raising or lowering a consumption power of the logic circuit from the logic circuit, as said interface.

2. A logic circuit module comprising:
   a built-in main processor;
   an interface for consumption power control;
   a function controlling a consumption power of another logic circuit module having a built-in main processor;
   a power circuit for the other logic circuit module; and
   a clock generator circuit for the other logic circuit,
   wherein the logic circuit further includes a power output interface as said interface.

3. A logic circuit module having a built-in main processor, comprising:
   a consumption power request status register which loads a consumption power request issued from another logic circuit module; and
   a consumption power control register which controls a consumption power of the other logic circuit module,
   wherein said processor:
      periodically monitors a value of said consumption power status register,
      sets a value of said consumption power control register to a proper value in accordance with the value of said consumption power status register, and
      supplies a proper clock signal and power to the other logic circuit module in accordance with the set value in said consumption power control register.

4. A logic circuit module having a built-in main processor, comprising:
   a consumption power request status register which loads a consumption power request issued from another logic circuit module; and
   a consumption power control register which controls a consumption power of the other logic circuit module,
   wherein said processor:
      periodically monitors a value of said consumption power status register,
      sets a value of said consumption power control register to a proper value in accordance with the value of said consumption power status register, and
      controls a clock generator circuit and power existing in an external of the logic circuit module in accordance with the set value in said consumption power control register.

5. A storage medium storing a logic circuit module comprising:
   a built-in main processor;
   an interface for consumption power control;
   a function controlling a consumption power of another logic circuit module having a built-in main processor;
   a power circuit for the other logic circuit module; and
   a clock generator circuit for the other logic circuit,
   wherein the logic circuit module functionally comprises a function of performing the operation of:
      an interface for consumption power control,
      a function of controlling a consumption power of another logic circuit module having a built-in main processor,
      a power circuit for the other logic circuit module, and
      a clock generator circuit for the other logic circuit.

6. A storage medium storing a logic circuit module comprising:
   a built-in main processor;
   an interface for consumption power control;
   a function controlling a consumption power of another logic circuit module having a built-in main processor;
   a power circuit for the other logic circuit module; and
   a clock generator circuit for the other logic circuit,
   wherein said interface receives a request of raising or lowering the consumption power of the other logic circuit from the other logic circuit, and
   wherein the logic circuit module functionally has an interface for outputting the request.

7. A storage medium storing a logic circuit module comprising:
   a built-in main processor;
   an interface for consumption power control;
   a function controlling a consumption power of another logic circuit module having a built-in main processor;
   a power circuit for the other logic circuit module; and
   a clock generator circuit for the other logic circuit,
   wherein the logic circuit module functionally has a power output interface as said interface.

8. A storage medium storing a logic circuit module implemented by a built-in main processor, wherein the logic circuit module functionally comprises:
   a consumption power request status register for loading a consumption power request issued from another logic circuit module; and
   a consumption power control register for controlling a consumption power of the other logic circuit module,
   wherein the processor:
      periodically monitors a value of said consumption power status register,
      setting a value of said consumption power control register to a proper value in accordance with the value of said consumption power status register, and
      supplies a proper clock signal and power to the other logic circuit module in accordance with the set value in said consumption power control register, or controls a clock generator circuit and power outside of the logic circuit module in accordance with the set value in said consumption power control register.

9. A method of designing a system LSI from a combination of a plurality of logic circuit modules each having at least one consumption power control interface, the method comprising steps of:

interconnecting the consumption power interfaces of respective logic circuit modules on a display screen to allow a specification of the consumption power control interface to be input; and automatically adding a voltage level shifter or a synchronization circuit to the respective logic circuit modules in accordance with the input specification.

* * * * *